United States Patent
Sato et al.

(10) Patent No.: US 11,169,732 B2
(45) Date of Patent: Nov. 9, 2021

(54) COMPUTING DEVICE

(71) Applicant: Kabushiki Kaisha Toshiba, Tokyo (JP)

(72) Inventors: Rie Sato, Yokohama Kanagawa (JP); Koichi Mizushima, Kamakura Kanagawa (JP); Hayato Goto, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 553 days.

(21) Appl. No.: 15/924,690

(22) Filed: Mar. 19, 2018

(65) Prior Publication Data
US 2018/0335973 A1   Nov. 22, 2018

(30) Foreign Application Priority Data

May 18, 2017 (JP) ............................ JP2017-099240
Nov. 20, 2017 (JP) ............................ JP2017-222954

(51) Int. Cl.
| | |
|---|---|
| *G06F 3/06* | (2006.01) |
| *G11C 5/02* | (2006.01) |
| *G11C 11/16* | (2006.01) |
| *G11C 11/54* | (2006.01) |

(52) U.S. Cl.
CPC ............ *G06F 3/0655* (2013.01); *G06F 3/061* (2013.01); *G06F 3/0676* (2013.01); *G11C 5/02* (2013.01); *G11C 11/16* (2013.01); *G11C 11/54* (2013.01)

(58) Field of Classification Search
CPC ..... G11C 11/02; G11C 11/54; G11C 19/0841; G11C 11/16; G11C 5/02; G06F 3/0655; G06F 3/0625; G06F 3/0658; G06F 3/0676; G06F 3/061; Y02D 10/00
See application file for complete search history.

(56) References Cited

U.S. PATENT DOCUMENTS

| | | |
|---|---|---|
| 4,141,076 A | 2/1979 | Naden |
| 4,149,267 A | 4/1979 | Quadri |
| | (Continued) | |

FOREIGN PATENT DOCUMENTS

| | | |
|---|---|---|
| JP | S52-11462 Y1 | 3/1977 |
| JP | H1-166389 A | 6/1989 |
| | (Continued) | |

OTHER PUBLICATIONS

Sze et al., "Efficient Processing of Deep Neural Networks: A Tutorial and Survey", Dec. 2017, IEEE, Proceedings of the IEEE vol. 105, No. 12, pp. 2295-2329. (Year: 2017).*

*Primary Examiner* — Jay W. Radke
(74) *Attorney, Agent, or Firm* — Finnegan, Henderson, Farabow, Garrett & Dunner L.L.P.

(57) ABSTRACT

According to one embodiment, a computing device includes a first magnetic section, a first reading section, a memory section, and a computing section. The first reading section is configured to output a first signal corresponding to a magnetization state of a partial region of the first magnetic section. The computing section is configured to perform computation using the first signal when first information stored in the memory section is in a first state, and to perform computation using a reverse signal of the first signal when the first information is in a second state.

12 Claims, 17 Drawing Sheets

(56) References Cited

U.S. PATENT DOCUMENTS

| | | | |
|---|---|---|---|
| 6,209,056 B1* | 3/2001 | Suh | G11C 5/025 |
| | | | 711/5 |
| 7,626,844 B1 | 12/2009 | Moriya et al. | |
| 8,127,075 B2 | 2/2012 | Thibadeau et al. | |
| 9,710,265 B1* | 7/2017 | Temam | G06F 13/28 |
| 2004/0103095 A1* | 5/2004 | Matsugu | G06K 9/00973 |
| 2006/0002180 A1* | 1/2006 | Frey | G11C 16/10 |
| | | | 365/158 |
| 2010/0284209 A1* | 11/2010 | Kim | G11C 11/14 |
| | | | 365/80 |
| 2012/0224283 A1* | 9/2012 | Sato | G11B 5/66 |
| | | | 360/324.11 |
| 2012/0251032 A1* | 10/2012 | Kato | H04B 10/556 |
| | | | 385/3 |
| 2013/0050866 A1 | 2/2013 | Matsubara et al. | |
| 2015/0135031 A1* | 5/2015 | Cohen | G11C 29/52 |
| | | | 714/758 |
| 2017/0039472 A1 | 2/2017 | Kudo | |
| 2017/0047913 A1 | 2/2017 | Roy et al. | |
| 2017/0178746 A1 | 6/2017 | Nagaosa et al. | |
| 2017/0185380 A1 | 6/2017 | Hayashi et al. | |
| 2019/0180183 A1* | 6/2019 | Diamant | G06N 3/084 |

FOREIGN PATENT DOCUMENTS

| | | |
|---|---|---|
| JP | H3-48364 A | 3/1991 |
| JP | H4-266048 A | 9/1992 |
| JP | 2009-32259 A | 2/2009 |
| JP | 2009-230807 A | 10/2009 |
| JP | 2010-283370 A | 12/2010 |
| JP | 2012-501037 A | 1/2012 |
| JP | 2013-48001 A | 3/2013 |
| JP | 2017-33385 A | 2/2017 |
| WO | WO 2016/006071 A1 | 1/2016 |
| WO | WO 2016/067744 A1 | 5/2016 |

* cited by examiner $$W = \begin{pmatrix} 0 & -2 & 0 & 0 & 0 \\ -2 & 0 & 0 & 0 & 0 \\ 0 & 0 & 0 & -2 & 2 \\ 0 & 0 & -2 & 0 & -2 \\ 0 & 0 & 2 & -2 & 0 \end{pmatrix}$$

$$W^{(1)} = \begin{pmatrix} 0 & -1 & -1 & 1 & -1 \\ -1 & 0 & 1 & -1 & 1 \\ -1 & 1 & 0 & -1 & 1 \\ 1 & -1 & -1 & 0 & -1 \\ -1 & 1 & 1 & -1 & 0 \end{pmatrix} \quad W^{(2)} = \begin{pmatrix} 0 & -1 & 1 & -1 & 1 \\ -1 & 0 & -1 & 1 & -1 \\ 1 & -1 & 0 & -1 & 1 \\ -1 & 1 & -1 & 0 & -1 \\ 1 & -1 & 1 & -1 & 0 \end{pmatrix}$$

US 11,169,732 B2

COMPUTING DEVICE

CROSS-REFERENCE TO RELATED APPLICATIONS

This application is based upon and claims the benefit of priority from Japanese Patent Application No. 2017-099240, filed on May 18, 2017 and Japanese Patent Application No. 2017-222954, filed on Nov. 20, 2017; the entire contents of which are incorporated herein by reference.

FIELD

Embodiments described herein relate generally to a computing device.

BACKGROUND

A computing device with reduced energy consumption is desired.

DETAILED DESCRIPTION

Figure 1:
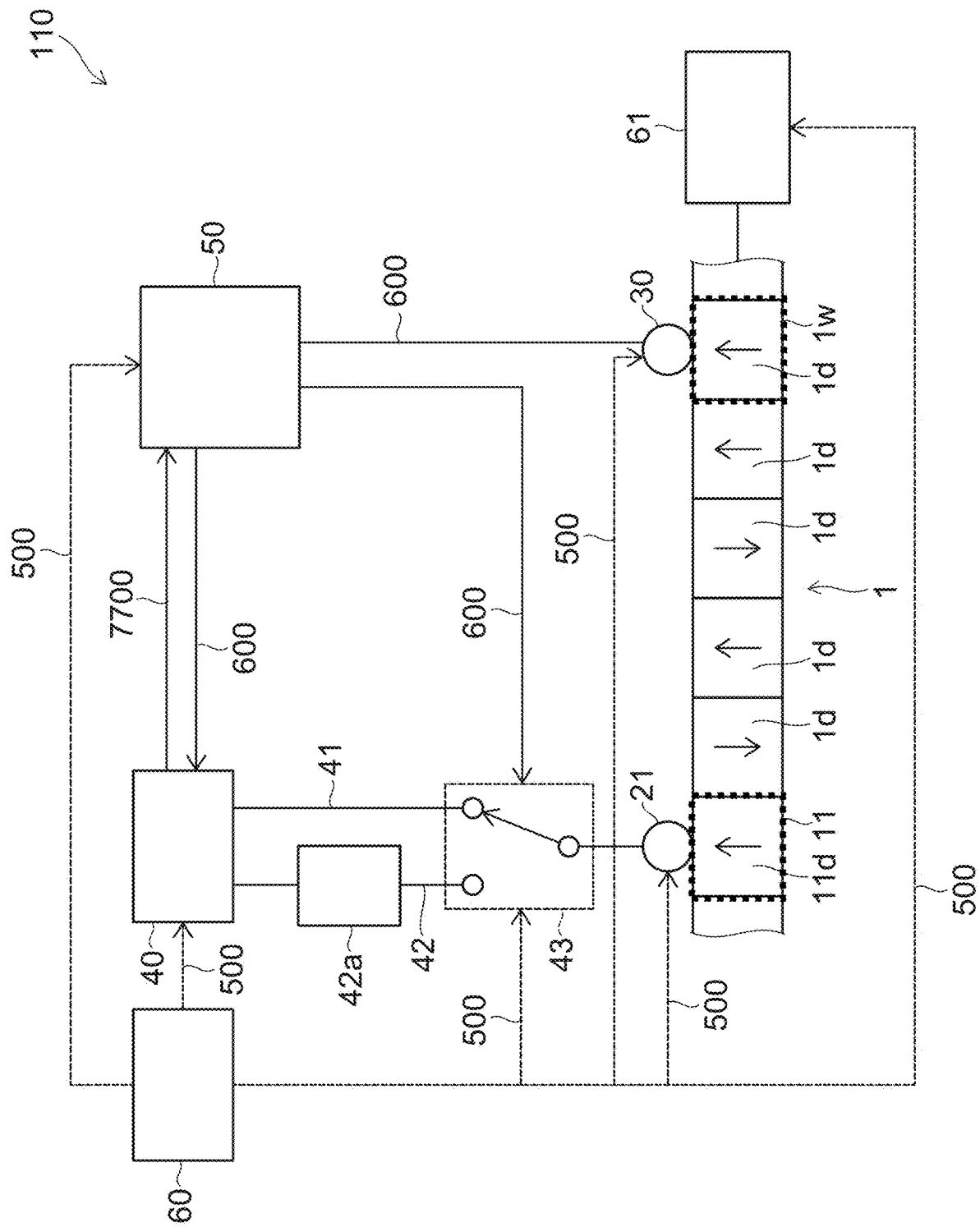
FIG. 1 is a schematic view illustrating a computing device according to a first embodiment.

According to one embodiment, a computing device includes a first magnetic section, a first reading section, a memory section, and a computing section. The first reading section is configured to output a first signal corresponding to a magnetization state of a partial region of the first magnetic section. The computing section is configured to perform computation using the first signal when first information stored in the memory section is in a first state, and to perform computation using a reverse signal of the first signal when the first information is in a second state.

Embodiments of the invention will now be described with reference to the drawings.

In the drawings and the specification of the application, components similar to those described thereinabove are marked with like reference numerals, and a detailed description is omitted as appropriate.

FIG. 1 is a schematic view illustrating a computing device according to a first embodiment.

As shown in FIG. 1, the computing device 110 according to the first embodiment includes a first magnetic section 1, a first reading section 21, a writing section 30, a computing section 40, a memory section 50, a control section 60, and a driving circuit 61.

The first magnetic section 1 includes e.g. a plurality of magnetic domains 1d. In FIG. 1, the arrow attached to the magnetic domain 1d represents an example of the direction of magnetization. The first reading section 21 is connected to the first magnetic section 1. The first reading section 21 outputs a first signal corresponding to the magnetization state of a partial region of the first magnetic section 1. That is, the first reading section 21 reads magnetization information of one of the plurality of magnetic domains 1d. The writing section 30 controls the magnetization state of a different partial region of the first magnetic section 1. That is, the writing section 30 writes magnetization information to a different one of the plurality of magnetic domains 1d.

In a specific example, the first magnetic section 1 includes a first region 11 and a writing region 1w. The first region 11 includes a first magnetic domain 11d. The first magnetic domain 11d corresponds to one of the plurality of magnetic domains 1d. The direction of magnetization of the first magnetic domain 11d corresponds to first magnetization information stored in the first region 11.

The first reading section 21 is connected to the first region 11. The first reading section 21 reads magnetization information of the first magnetic domain 11d. The writing section 30 is connected to the writing region 1w. The writing region 1w includes one of the plurality of magnetic domains 1d. The writing section 30 writes magnetization information to the aforementioned one of the plurality of magnetic domains 1d.

The computing section 40 performs computation using the first signal outputted from the first reading section 21. That is, the computing section 40 performs computation using the magnetization information read by the first reading section 21. The memory section 50 stores first information used to process the read magnetization information. The first information are transmitted to the computing section 40, the switch 43, and the writing section 30 via interconnects 600. The computing section 40 performs computation using the first signal (magnetization information) when the first information is in a first state. The computing section 40 performs computation using the reverse signal of the first signal (reverse information of magnetization information) when the first information is in a second state.

The computing device 110 further includes e.g. a first interconnect 41, a second interconnect 42, and a switch 43. The second interconnect 42 includes a signal reversal section 42a. The switch 43 is connected to the first interconnect 41 when the first information of the memory section 50 is in the first state. The switch 43 is connected to the second interconnect 42 when the first information is in the second state.

When the switch 43 is connected to the first interconnect 41, the magnetization information read by the first reading section 21 is inputted to the computing section 40 without reversal. When the switch 43 is connected to the second interconnect 42, the magnetization information read by the first reading section 21 is reversed by the signal reversal section 42a and inputted to the computing section 40. The switch 43 may not be connected to the first interconnect 41 and the second interconnect 42 when the first information of the memory section 50 is in a third state.

The computing section 40 provides the computation result to the memory section 50 via an interconnect 700, and the memory section 50 stores the computation result as second information. The writing section 30 places a different partial region of the first magnetic section 1 in a magnetization state corresponding to the second information. That is, the writing section 30 writes the second information as magnetization information to the writing region 1w.

The driving circuit 61 is connected to the first magnetic section 1. The driving circuit 61 supplies current between the first region 11 and the writing region 1w of the first magnetic section 1. When current is supplied to the first magnetic section 1, the plurality of magnetic domains 1d move. The direction of movement of the plurality of magnetic domains 1d is e.g. opposite to the direction of the current. The magnetization information of the plurality of magnetic domains 1d can be read by repeating supply of current and reading of magnetization information. A plurality of pieces of magnetization information can be written to the first magnetic section 1 by repeating supply of current and writing of magnetization information.

The control section 60 controls the operation of e.g. the first reading section 21, the writing section 30, the computing section 40, the switch 43, the memory section 50, and the driving circuit 61 via interconnects 500.

This embodiment enables scale increase and reduction of energy consumption of a computing device.

A specific example of the computing device 110 according to the first embodiment is described below.

The first magnetic section 1 is e.g. a racetrack element. The first magnetic section 1 may be a skyrmion element or bubble domain element. In these cases, the driving circuit 61 can move the plurality of magnetic domains 1d with respect to the first reading section 21 and the writing section 30 by supplying current to the first magnetic section 1. The first magnetic section 1 may be a hard disk or magnetic tape. In these cases, the control section 60 can move the plurality of magnetic domains 1d or skyrmions with respect to the first reading section 21 and the writing section 30 by moving the first magnetic section 1.

Figure 2A:
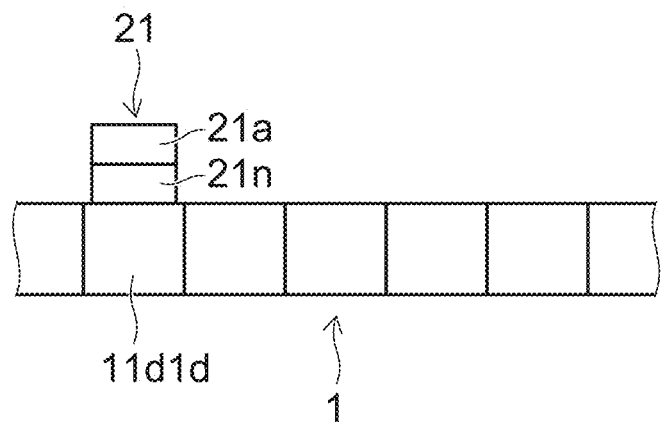
FIGS. 2A to 2C are schematic sectional views illustrating part of the computing device according to the first embodiment.
Figure 2B:
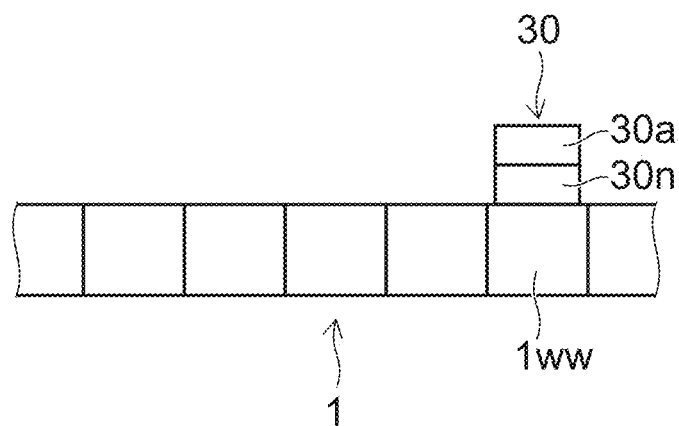
Figure 2C:
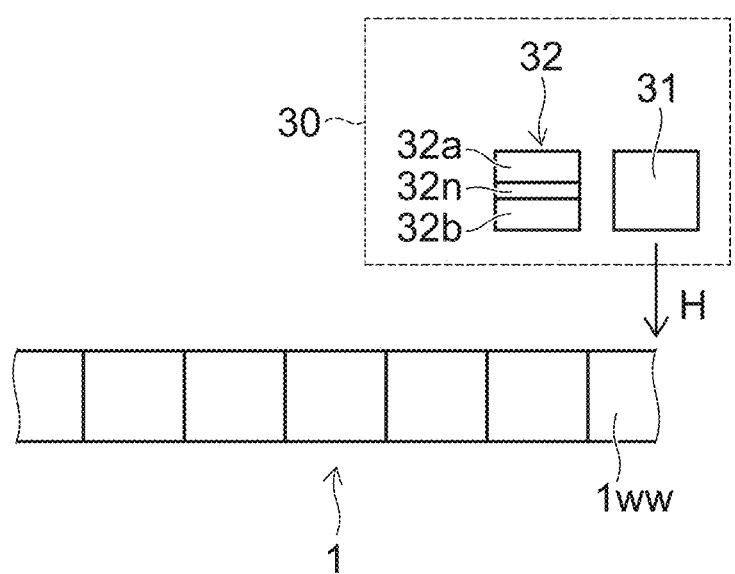

FIGS. 2A to 2C are schematic sectional views illustrating part of the computing device according to the first embodiment.

As shown in FIG. 2A, the first reading section 21 includes e.g. a reading magnetic layer 21a and a reading intermediate layer 21n. The reading intermediate layer 21n is provided between the reading magnetic layer 21a and the writing region 1w of the first magnetic section 1. The first reading section 21 reads magnetization information of the magnetic domain 1d using e.g. the giant magnetoresistance effect or tunnel magnetoresistance effect. The electric resistance between the reading magnetic layer 21a and the first magnetic section 1 changes with the direction of magnetization of the magnetic domain 1d. Each of the plurality of states having different electrical resistances corresponds to the magnetization information to be stored.

As shown in FIG. 2B, the writing section 30 includes e.g. a writing magnetic layer 30a and a dielectric layer 30n. The dielectric layer 30n is provided between the writing magnetic layer 30a and the first magnetic section 1. By applying voltage between the writing magnetic layer 30a and the first magnetic section 1, an electric field is applied to the writing region 1w of the first magnetic section 1. When the electric field is applied, for instance, the direction of magnetization of the writing region 1w undergoes precession. By applying voltage for an appropriate time, the magnetization of the writing region 1w can be directed to a desired direction.

Alternatively, as shown in FIG. 2C, the writing section 30 includes e.g. a magnetic field application section 31 and a magnetic element 32. The magnetic field application section 31 applies a magnetic field H to the first magnetic section 1. The direction of the magnetic field H corresponds to the magnetization information to be stored in the writing region 1w. The magnetic element 32 includes a first magnetic layer 32a, a writing intermediate layer 32n, and a second magnetic layer 32b. The writing intermediate layer 32n is provided between the first magnetic layer 32a and the second magnetic layer 32b. By supplying current to the magnetic element 32, a high-frequency wave is emitted from the magnetic element 32. The magnetic element 32 functions as e.g. a spin torque oscillator element. This facilitates writing magnetization information to the writing region 1w. Furthermore, at the time of writing, the first magnetic section 1 may be supplied with current to heat the writing region 1w. This further facilitates writing magnetization information to the writing region 1w.

The computing section 40 performs computation such as addition of magnetization information read by the first reading section 21, multiplication of the addition value and a constant, and magnitude comparison of the addition values. The computing section 40 includes e.g. a computing circuit including semiconductor elements such as MOS transistors. The memory section 50 includes e.g. a hard disk or flash memory.

Figure 3:
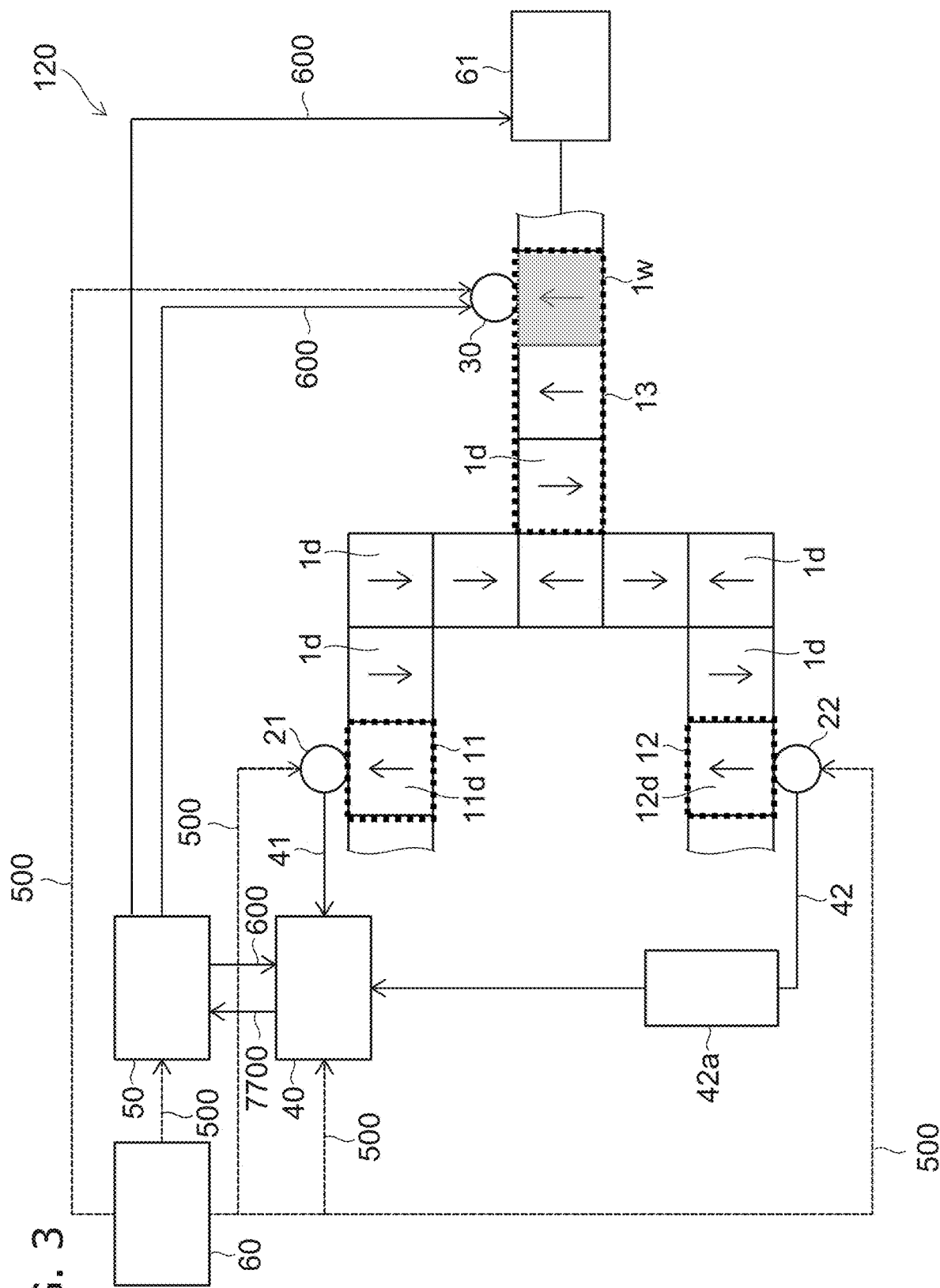
FIG. 3 is a schematic view illustrating a computing device according to a second embodiment.

FIG. 3 is a schematic view illustrating a computing device according to a second embodiment.

The computing device 120 according to the second embodiment further includes a second reading section 22. In the computing device 120, the first magnetic section 1 further includes a second region 12 and a third region 13. The second region 12 includes a second magnetic domain 12d. The direction of magnetization of the second magnetic domain 12d corresponds to second magnetization information stored in the second region 12.

The first reading section 21 is connected to the first region 11. The first reading section 21 outputs a first signal corresponding to the magnetization state of the first region 11. That is, the first reading section 21 reads first magnetization information of the first magnetic domain 11d. The second reading section 22 is connected to the second region 12. The second reading section 22 outputs a second signal corresponding to the magnetization state of the second region 12. That is, the second reading section 22 reads second magnetization information of the second magnetic domain 12d. The third region 13 is connected between the first region 11 and the second region 12. The third region 13 includes a writing region 1w.

The driving circuit 61 supplies current between the first region 11 and the third region 13, or between the second region 12 and the third region 13. When current is supplied between the first region 11 and the third region 13, the magnetic domains 1d of the first region 11 and the third region 13 move in accordance with the direction of the current. When current is supplied between the second region 12 and the third region 13, the magnetic domains 1d of the second region 12 and the third region 13 move in accordance with the direction of the current.

Supply of current to the first magnetic section 1 is based on first information stored in the memory section 50. The memory section 50 which provides the first information to the writing section 30, the computing section 40, and the driving circuit 61 via interconnects 600. The first information relates to e.g. the interaction between magnetization information stored in one of the plurality of magnetic domains 1d and magnetization information stored in a different one of the plurality of magnetic domains 1d. The first state corresponds to e.g. the state in which the sign of the value representing the interaction is one of positive and negative. The second state corresponds to e.g. the state in which the sign of the value representing the interaction is the other of positive and negative.

When the first information is in the first state, the driving circuit 61 supplies current between the first region 11 and the third region 13. By the supply of current, a different magnetic domain 1d moves to the first region 11. The first reading section 21 reads first magnetization information of the first magnetic domain 11d located in the first region 11. The first signal outputted from the first reading section 21 is inputted from the first interconnect 41 to the computing section 40. That is, the first magnetization information is inputted from the first interconnect 41 to the computing section 40.

When the first information is in the second state, the driving circuit 61 supplies current between the second region 12 and the third region 13. By the supply of current, a different magnetic domain 1d moves to the second region 12. The second reading section 22 reads second magnetization information of the second magnetic domain 12d located in the second region 12. The second signal outputted from the second reading section 22 is reversed by the signal reversal section 42a of the second interconnect 42 and inputted to the computing section 40. That is, the second magnetization information is reversed by the signal reversal section 42a of the second interconnect 42 and inputted to the computing section 40.

The operation of the writing section 30, the computing section 40, and the memory section 50 is similar to e.g. that of the computing device 110 shown in FIG. 1. The computing section 40 transmits the computation result to the memory section via an interconnect 700, and the memory section 50 stores the computation result as second information. The writing section 30 places at least part of the third region 13 in a magnetization state corresponding to the second information. That is, the writing section 30 writes the second information as magnetization information to the writing region 1w.

Figure 4:
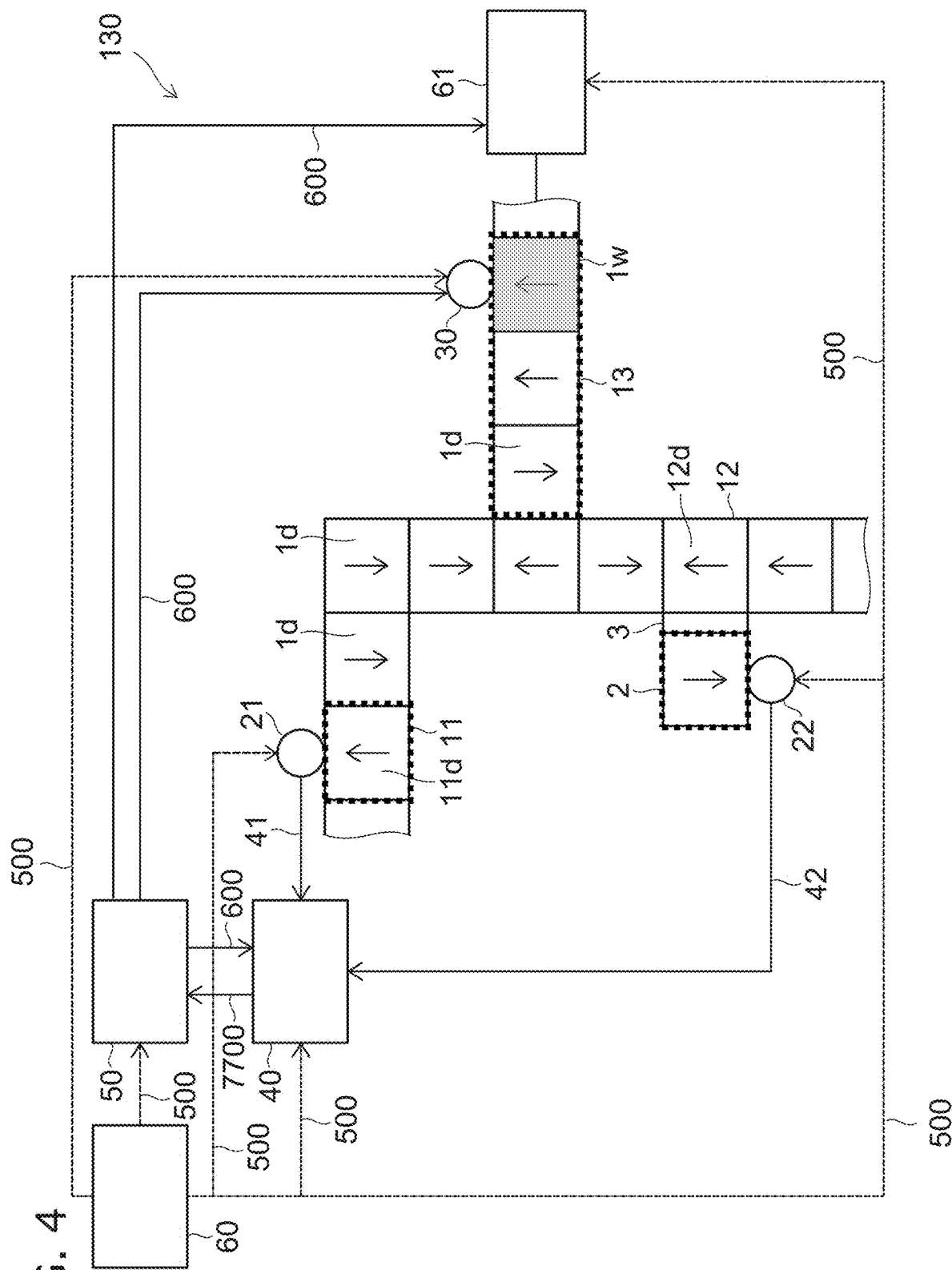
FIG. 4 is a schematic view illustrating a computing device according to a third embodiment.

FIG. 4 is a schematic view illustrating a computing device according to a third embodiment.

The computing device 130 according to the third embodiment further includes a second magnetic section 2 and a nonmagnetic section 3. The nonmagnetic section 3 is provided between the second magnetic section 2 and the second region 12. The direction of magnetization of the second magnetic section 2 is opposite to the direction of magnetization of the second region 12. This is based on e.g. antiferromagnetic coupling between the second magnetic section 2 and the second region 12.

The first reading section 21 outputs a first signal corresponding to the magnetization state of the first region 11. That is, the first reading section 21 reads first magnetization information of the first magnetic domain 11d. The second reading section 22 outputs a second signal corresponding to the magnetization state of the second magnetic section 2. That is, the second reading section 22 reads magnetization information of the second magnetic section 2. This corresponds to reverse information of the second magnetization information of the second magnetic domain 12d.

The first magnetization information is inputted from the first interconnect 41 to the computing section 40. The reverse information of the second magnetization information is inputted from the second interconnect 42 to the computing section 40. In the computing device 130, the second magnetization information of the second magnetic domain 12d is reversed by the second magnetic section 2 and the nonmagnetic section 3. This eliminates the need of the signal reversal section 42a shown in FIG. 3. Thus, the energy consumption can be reduced compared with the computing devices 110 and 120.

The operation of the writing section 30, the computing section 40, and the memory section 50 is similar to e.g. that of the computing device 110 shown in FIG. 1. The operation of the driving circuit 61 is similar to e.g. that of the computing device 120 shown in FIG. 3.

Fourth Embodiment

Figure 5:
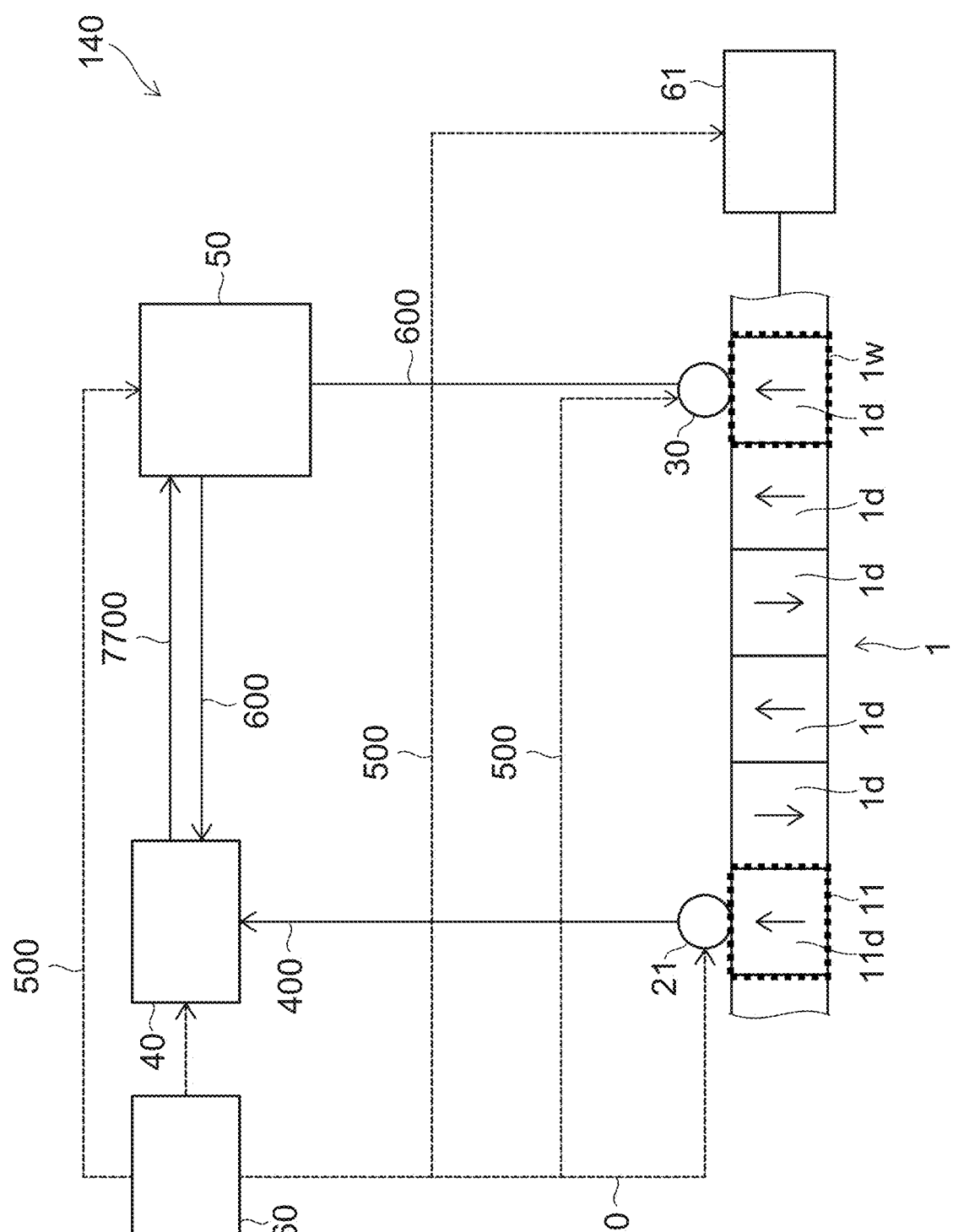
FIG. 5 is a schematic view illustrating a computing device according to a fourth embodiment.

FIG. 5 is a schematic view illustrating a computing device according to a fourth embodiment.

In the computing device 140 according to the fourth embodiment, the first reading section 21 reads first magnetization information from the magnetic domain 1d. Then, the first magnetization information is inputted from the first reading section 21 to the computing section 40 via interconnect 400. The first information of the memory section 50 is inputted to the computing section 40 via interconnect 600.

The computing section 40 performs computation using the first magnetization information when the first information is in the first state. The computing section 40 performs computation using the reverse information of the first magnetization information when the first information is in the second state. In the computing device 140, the computing section 40 refers to the first information and reverses the magnetization information based on the state of the first information. This eliminates the need of e.g. the switch 43 shown in FIG. 1.

Fifth Embodiment

Figure 6:
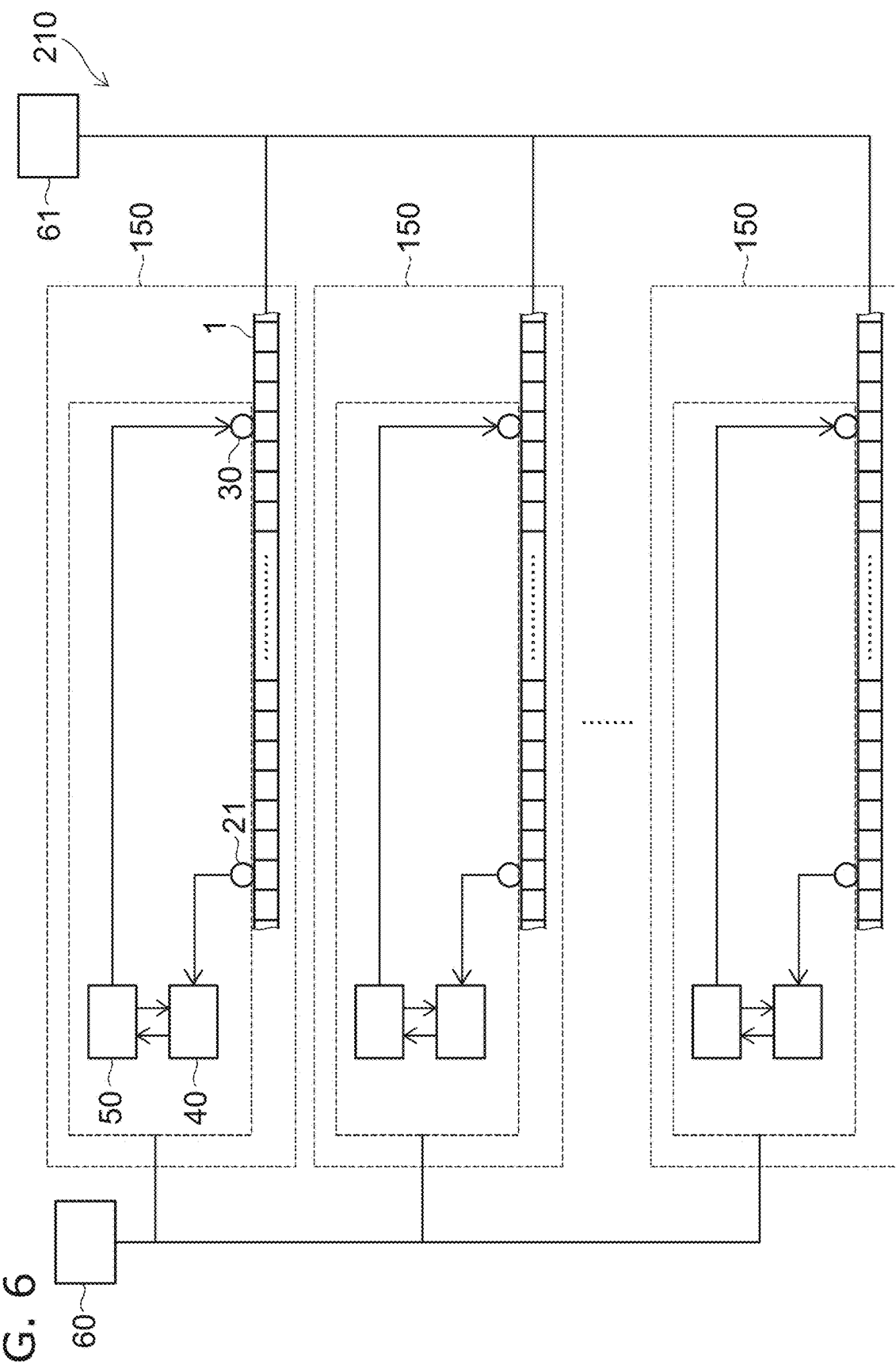
FIG. 6 is a schematic view illustrating a computing system according to a fifth embodiment.

FIG. 6 is a schematic view illustrating a computing system according to a fifth embodiment.

The computing device 210 according to the fifth embodiment includes a plurality of computing blocks 150, a control section 60, and a driving circuit 61. Each of the plurality of computing blocks 150 includes e.g. a first magnetic section 1, a first reading section 21, a writing section 30, a computing section 40, and a memory section 50.

The driving circuit 61 is connected to a plurality of first magnetic sections 1. The control section 60 is connected to a plurality of first reading sections 21, a plurality of writing sections 30, a plurality of computing sections 40, and a plurality of memory sections 50. The driving circuit 61 supplies current to at least one of the plurality of first magnetic sections 1. Based on an instruction from the control section 60, in at least one of the plurality of computing blocks 150, the computing section 40 performs computation using the magnetization information stored in the first magnetic section 1. The computing device 210 may include one control section alone. In this case, one control section functions as the driving circuit 61 and the control section 60.

The computing block 150 may include a configuration similar to that of the computing devices 120 and 130 shown in FIGS. 3 and 4. For instance, the first magnetic section 1 of the computing block 150 may include a first region 11, a second region 12, and a third region 13 as shown in FIG. 3. In this case, the computing block 150 includes a first reading section 21 and a second reading section 22.

The computing device 210 according to this embodiment includes a plurality of computing blocks 150. Each computing block 150 includes e.g. a first magnetic section 1, a first reading section 21, a computing section 40, and a memory section 50. This embodiment enables scale increase and reduction of energy consumption of a computing system.

The computing device and the computing system according to the embodiments described above are used in e.g. an interconnected neural network device.

Today there is demand for computers and electronic devices with higher performance and higher functionality. It is desired that these can address a huge amount of information processing related to e.g. IoT (Internet of Things), AI (Artificial Intelligence), and deep learning. On the other hand, it is also desired to develop energy-saving electronics in the context of $CO_2$ reduction discussed worldwide and electric power condition after the Great East Japan Earthquake.

Figure 7:
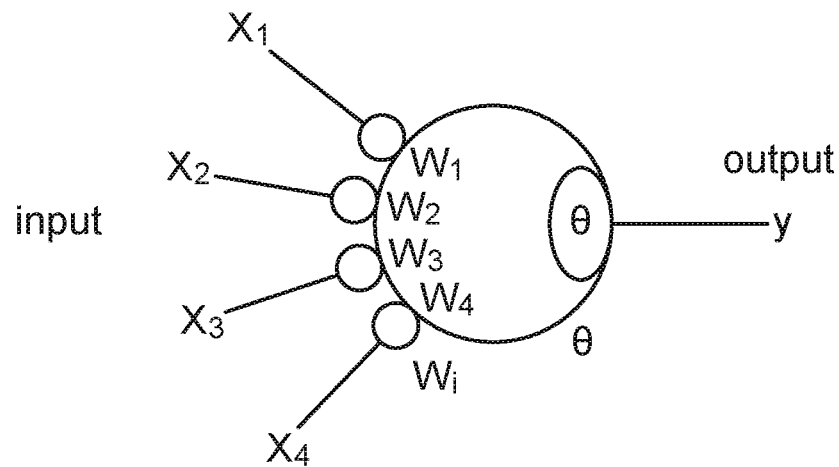
FIG. 7 is a schematic view showing a neuron model.

In this situation, neural networks as biomimetic energy-saving electronics have drawn attention again in recent years. The relationship between neural networks and electronics has a very long history. In particular, the neuron model of McCulloch and Pitts published in 1943 is well known (W. S. McCulloch and W. Pitts: Bull. Math. Biophys. 5, 115 (1943)). FIG. 7 is a schematic view showing a neuron model. This model is provided with multiple inputs, each input being weighted. When the sum of inputs ($x_i$) having weights ($w_i$) exceeds a threshold θ, a pulse is outputted (fired).

Figure 8:
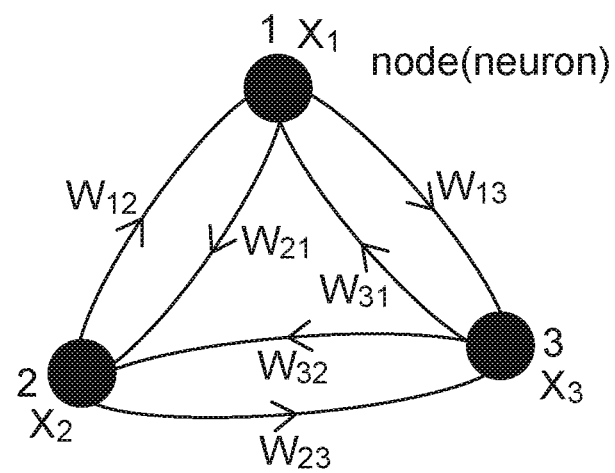
FIG. 8 is a schematic view showing an interconnected network.

Subsequently, a great breakthrough in the field of neural networks was achieved by Hopfield in 1982 (J. J. Hopfield: Proc. Natl. Acad. Sci. U.S.A. 79, 2554 (1982)). FIG. 8 is a schematic view showing an interconnected network. He demonstrated that an interconnected network based on the unit shown in FIG. 8 can be represented by the Hamiltonian of the Ising spin model. This made it possible to consider information processing in neural networks by using statistical mechanics of spin systems. Furthermore, the Ising spin, assuming binary states of up/down spin, can be assigned to the activity of neurons and information bits.

The Hopfield model has greatly contributed so far to the development in the field of software. On the other hand, the development of hardware based on this model has also been active in recent years. ReRAM (resistance change memory) has been studied as a kind of nonvolatile memory. The resistance change of ReRAM in response to voltage application is considered to be suitable to neural imitation, and its research has been pursued. However, reports have been made only on small-scale networks. The situation is similar regarding resistance change elements based on spin-orbit torque.

As a full-fledged brain neural network, an element called the TrueNorth chip was developed in 2014 by collaboration of IBM and Cornell University (P. A. Merolla et al., Science 345, 668 (2014)). This element, manufactured by 28-nm CMOS technology, operates as a million neurons as a whole. However, it is smaller in scale, and far greater in power consumption, than the human brain composed of 14 billion neurons. In order to improve the performance of low power consumption, use of stochastic resonance associated with thermal fluctuation has been considered in recent years, and e.g. spin glass materials suitable thereto have also been introduced (M. Kobayashi et al.: Appl. Phys. Lett. 92, 082502 (2008)). However, there has been no proposal of specific devices.

As described above, the neural network device is promising as a large-scale energy-saving information processing device comparable to the human brain. However, it is very insufficient at present regarding both scale increase and energy saving. The embodiments of this invention provide a computing device being applicable to neural network devices and enabling scale increase and energy saving of neural network devices.

A large-scale neural network device includes numerous neurons (nodes, units). It is considered that at least ten billion nodes are needed to make the number of neurons close to that of the human brain. In conventional neural network devices, one node is assigned to one ReRAM element, one transistor, or a circuit composed of a plurality of transistors. In the computing device according to the embodiment, one bit (one magnetic domain) of a domain wall motion-based magnetic recording element, a hard disk device, or a magnetic tape device can be assigned to one node. This makes it possible to configure a neural network device having ten billion or more nodes.

In the computation of a neural network device, as described later, the interaction between one node and at least part of the other nodes needs to be repetitively calculated numerous times in a signed manner. This large-scale repetitive computation can indeed be performed by calculation using conventional semiconductor circuits. However, it needs e.g. complex interconnects and branch switches, and consumes high energy. In contrast, the main part of this large-scale repetitive computation can be performed by combining a semiconductor device with a magnetic device such as a domain wall motion-based magnetic recording element, a hard disk device, or a magnetic tape device. This can achieve simplification of interconnects and significant energy saving. In particular, the skyrmion element has been discovered in recent years as a domain wall motion-based magnetic recording element. The skyrmion element is promising as an energy-saving computing element. This is because the skyrmion element can be driven by low-speed operation necessary for a neural network device (average frequency~several ten Hz) and at an extremely low current density ($10^2$ A/$cm^2$). Furthermore, in the computation by the domain wall motion-based magnetic recording element, the reversal operation of recording bit magnetization constituting a node (unit) can be performed using interlayer antiferromagnetic coupling. Writing to a bit can be performed using writing techniques such as thermal resonance assisted magnetization reversal and electric field effect magnetization reversal. Use of these techniques enables computation with significant energy-saving.

The overview of the Hopfield model is now described. In this neural network model, as shown in FIG. 8, n nodes (units) are coupled through interactions $w_{ij}$ (where i, j=1, 2, ..., n; $w_{ii}=0$, $w_{ij}=w_{ji}$). In the example of FIG. 8, n=3. Considering this system as analogous to a spin system, its energy is represented by the following equation 1.

$$E = -\frac{1}{2}\sum_{ij} w_{ij} x_i x_j - \sum_i \theta_i x_i \quad \text{[Equation 1]}$$

Here, $x_i$ is the value of node i. $x_i$ is +1 or −1. $\theta_i$ is the threshold (see FIG. 7) of node i. For simplicity of description, it is hereinafter assumed that $\theta_i=0$. In some cases, $x_i=+1, -1$ is replaced by $v_i=1, 0$. This description adopts $x_i$ by which the correspondence to the Ising spin is easily seen. The interaction $w_{ij}$ is generally represented by the following equation 2.

$$w_{ij} = \sum_l A_l w_{ij}^{(l)} \quad \text{[Equation 2]}$$

$w_{ij}^{(l)}$ (i≠j) is +1 or −1, and $w_{ij}^{(l)} = w_{ji}^{(l)} = w_{ii}^{(l)} = 0$. $A_l$ is a constant given by the problem. The solution to the problem is obtained by determining a vector $\{x_i\}$ minimizing the energy E under the given interaction matrix $\{w_{ij}\}$. This calculation is performed by the following procedure.

In the first step, the following equations 3 and 4 are calculated in consideration of the interaction $w_{ij}$ between an arbitrarily selected node i and all the other nodes j.

$$h_i = \sum_j w_{ij} x_j = \sum_l A_l h_i^{(l)} \quad \text{[Equation 3]}$$

$$h_i^{(l)} = \sum_j w_{ij}^{(l)} x_j \quad \text{[Equation 4]}$$

In analogy to the Ising spin, $h_i$ is referred to as a local magnetic field acting on node i. In the second step, the value $x_i$ of node i is updated as in the following equation 5 depending on whether the local magnetic field $h_i$ is positive or negative.

$x_i=+1 \; h_i \geq 0$ $x_i=-1 \; h_i<0$ [Equation 5]

This update is not synchronous update performed simultaneously on all the nodes, but is performed asynchronously for individual nodes. In the third step, for a randomly selected node k again, a local magnetic field $h_k$ is calculated as in the second step. Depending on whether its value is positive or negative, $x_k$ is updated as in equation 5. In the fourth step, the first to third steps are repeated. When all $x_i$ become unchanged, the vector $\{x_i\}$ is a solution. The procedure is similar in the case of e.g. the Boltzmann machine in which the Hopfield model is combined with simulated annealing (G. E. Hinton, Cognitive Science, Vol. 9, 147-169 (1985)).

Figure 9:
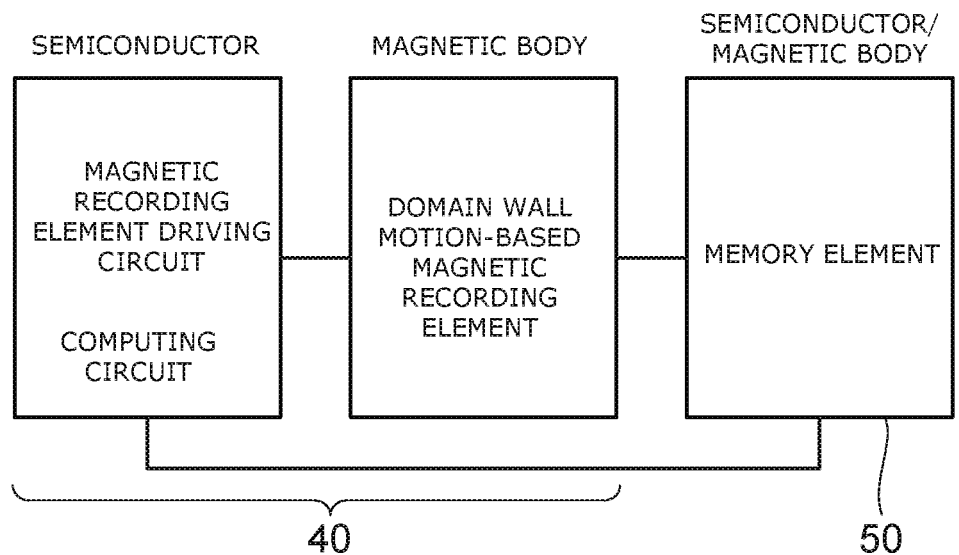
FIG. 9 is a schematic view showing the general configuration of a computing device according to the embodiment.

FIG. 9 is a schematic view showing the general configuration of a computing device according to the embodiment.

The computing device according to the embodiment includes e.g. a domain wall motion-based magnetic recording element and a semiconductor element. In the computing device according to the embodiment, the node of the Hopfield model can be assigned to one bit (one magnetic domain) of the first magnetic section 1. Furthermore, in the computation process of node update, the domain wall motion-based magnetic recording element can be used as a computing element together with the semiconductor element. Assigning the node to one bit (one magnetic domain) of the first magnetic section 1 facilitates constructing a large-scale device having a large number of nodes. In the repetitive computation of node update, the most computationally intensive part is equation 4 for determining the l-th component $h_i^{(l)}$ of the local magnetic field $h_i$ of node i. This requires calculating the sum for all the nodes except i in consideration of the sign of $w_{ij}^{(l)}$. In the computing device according to the embodiment, the main part of the calculation of $h_i^{(l)}$ is performed by the domain wall motion-based magnetic recording element ME. Less computationally intensive calculation of $h_i$ in equation 3 is performed by the computing circuit including the semiconductor element SE. The constants such as constant $A_l$ required to calculate equation 3 and constants $w_{ij}^{(l)}$ required to calculate equation 4 are stored in the memory section 50. The computing devices shown in FIGS. 1 to 5 can be used as a computing circuit for $h_i^{(l)}$.

Each bit (magnetic domain 1d) of the first magnetic section 1 constituting a node is written with an initial value by the writing section 30. The bit of the first magnetic section 1 is transferred by current supplied from the control section 60. First, the calculation of $h_i^{(l)}$ (l=1) is performed. Next, depending on whether $w_{ij}^{(l)}$ (l=1) is positive or negative, for instance, the circuit of the read signal is branched. In the case of $w_{ij}^{(l)}<0$, the reversed signal is inputted to the computing section 40. For instance, in the case of $w_{ij}^{(l)}=0$, the branch switch is opened, and the read signal is not transmitted to the computing circuit. Positive/negative pulses are summed in the computing circuit to obtain $h_i^{(l)}$. Subsequently, also for l=2 or more, $h_i^{(l)}$ (l=2, 3, 4, . . . ) are calculated. All $h_i^{(l)}$ and $A_l$ are used to calculate $h_i$ in equation 3. The calculation of equation 3 is a relatively small load, and can be performed using typical electronic circuits. Equation 5 is used to update the value $x_i$ of node i depending on whether $h_i$ is positive or negative. The calculation circuit of $h_i^{(l)}$ using the first magnetic section 1 has a much simpler interconnect pattern in a larger scale than in the case of using semiconductor circuits alone. Furthermore, this calculation circuit is superior in energy saving. A conceptual view of the simplification of the interconnect pattern is shown in FIGS. 10A and 10B.

Figure 10A:
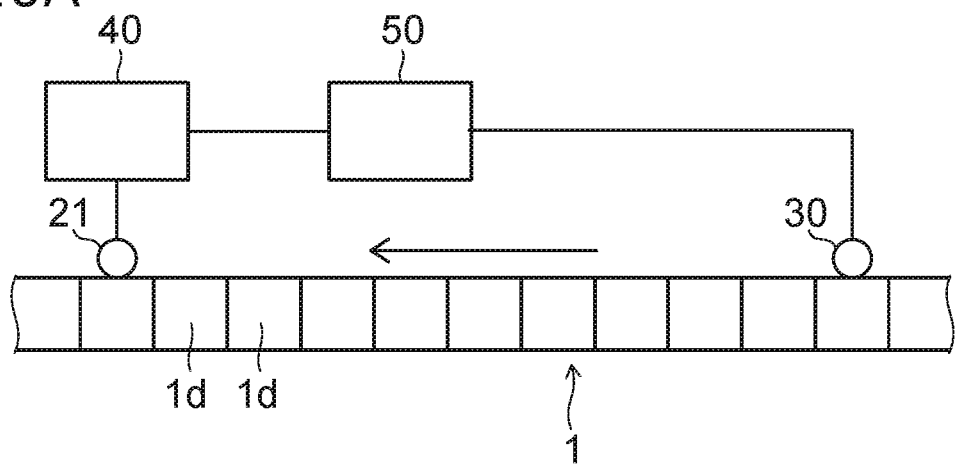
FIG. 10A is a schematic view showing part of the computing device according to the embodiment and FIG. 10B is a schematic view showing part of a computing device according to a reference example.

FIG. 10A is a schematic view showing part of the computing device according to the embodiment. FIG. 10B is a schematic view showing part of a computing device according to a reference example.

Figure 10B:
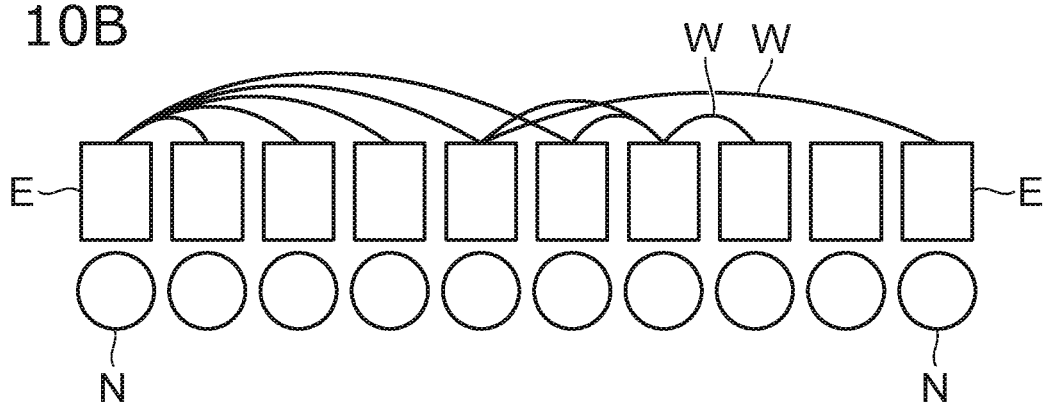

In the conventional interconnected neural network such as the TrueNorth chip introduced above, as shown in FIG. 10B, each neuron N is provided with an element E having a computing function and a memory function. These elements E are connected to each other by interconnects W. In contrast, as shown in FIG. 10A, the computing device according to the embodiment only needs one computing section 40 and one memory section 50 as a whole. Thus, the interconnect pattern can be made simpler. Furthermore, the overall device can also be configured separately for each region, like the cerebral cortex is composed of e.g. the visual area and the olfactory area.

For instance, the first information mentioned in the description of the computing device 110 shown in FIG. 1 corresponds to the interaction $w_{ij}$. $w_{ij}>0$ corresponds to the case where the first information is in the first state. $w_{ij}<0$ corresponds to the case where the first information is in the second state. In this case, the computing section 40 performs computation using the reversed magnetization information. $w_{ij}=0$ corresponds to the case where the first information is in the third state. The second information corresponds to e.g. the value $x_i$ of node i. Thus, after the value $x_i$ of node i is stored in the memory section 50, the writing section 30 writes this value $x_i$ to the writing region 1w of the first magnetic section 1.

Practical Example

Figures 11, 12A, 12B:
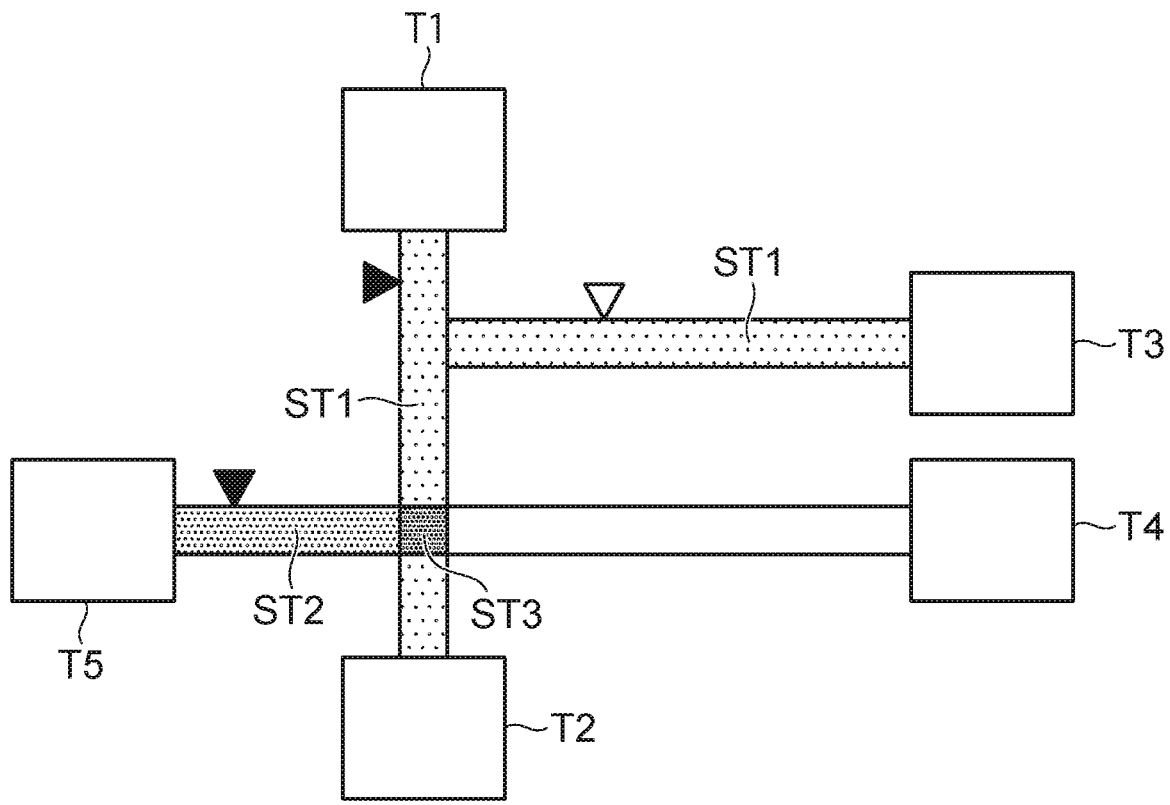
FIG. 11 is a schematic view showing part of a computing device according to a practical example.
FIGS. 12A and 12B are equations illustrating computation by the computing device according to the embodiment.

FIG. 11 is a schematic view showing part of a computing device according to a practical example.

In the example shown in FIG. 11, a first stacked body ST1, a second stacked body ST2, and a third stacked body ST3 are formed on a silicon substrate.

The first stacked body ST1 includes Ta (3 nm)/Pt (2 nm)/Co (0.3 nm)/Ni (0.6 nm)/Co (0.3 nm)/Pt (2 nm)/Ta (3 nm).

The second stacked body ST2 includes Ta (3 nm)/Pt (2 nm)/Co (0.2 nm)/Ni (0.8 nm)/Co (0.2 nm)/Pt (2 nm)/Ta (3 nm).

The third stacked body ST3 includes Ta (3 nm)/Pt (2 nm)/Co (0.2 nm)/Ni (0.8 nm)/Co (0.2 nm)/Ru (2 nm)/Co (0.3 nm)/Ni (0.6 nm)/Co (0.3 nm)/Pt (2 nm)/Ta (3 nm).

The nanowire element shown in FIG. 11 is formed from the first stacked body ST1, the second stacked body ST2, and the third stacked body ST3. Formation of each film was performed using the DC magnetron sputtering method. Processing of the film was performed using electron beam lithography and argon ion milling. The nanowire element includes terminals T1, T2, T3, T4, and T5. Each of the terminals T1-T5 is an Au layer of 100 nm. The terminals T1-T5 are used to supply current to the nanowire element.

The stacked body ST3 has antiferromagnetic coupling. Writing and reading a bit in the nanowire element were performed using a static tester. The writing head position and the reading head position are represented by a white triangle and a black triangle mark in FIG. 11, respectively. Transfer of the written bit magnetization is performed by applying a current pulse between the terminal T1 and the terminal T3, or between the terminal T2 and the terminal T3. Transfer of the magnetization bit reversed by antiferromagnetic coupling is performed by applying a current pulse between the terminal T4 and the terminal T5. In the case of $w_{ij}>0$, a current pulse is applied between the terminal T1 and the terminal T3. In the case of $w_{ij}<0$, a current pulse is applied between the terminal T2 and the terminal T3.

FIGS. 12A and 12B are equations illustrating computation by the computing device according to the embodiment.

Here, consider the case where the interaction matrix w is given by the 5×5 matrix $\{w_{ij}\}$ shown in FIG. 12A. w is rewritten as the sum of two matrices $w^{(1)}$ and $w^{(2)}$ shown in FIG. 12B. Under this w, a vector $\{x_i\}$ minimizing the energy E is determined using the element of FIG. 7. As an initial value of vector $\{x_i\}$, (1 1 1 1 1) was written to the element by the writing head of the static tester. The value of $h_i$ was determined by adding positive and negative pulses measured by two reading heads. Based on whether $h_i$ was positive or negative, $x_i$ was updated in accordance with equation 5. The order of the updated nodes i was set to 3, 1, 5, 2, 4, 3, 1, 5, 2, 4, . . . .

The observed value of $h_i$ and the updated value of $x_i$ are sequentially as follows: $h_3=0\geq 0$; $x_3=1$, $h_1=-2<0$; $x_1=-1$, $h_5=2\geq 0$; $x_5=1$, $h_2=2\geq 0$; $x_2=1$, $h_4=-6<0$; $x_4=-1$, $h_3\geq 0$; $x_3=1$, $h_1<0$; $x_1=-1$, $h_5\geq 0$; $x_5=1$, $h_2\geq 0$; $x_2=1$, $h_4<0$; $x_4=-1$. It was found that vector $\{x_i\}$ converges to (−1 1 1 −1 1).

Next, a similar computation was performed by setting the order of the updated nodes i to 2, 4, 3, 5, 1, 2, 4, 3, 5, 1, . . . . It was found that vector $\{x_i\}$ converges to (1 −1 1 −1 1). Subsequently, the nodes were updated in various orders. As a result, it was found that the vector converges to one of the two aforementioned vectors. That is, it was found that there are two stable patterns (values of nodes) $\{x_i\}=(-1\ 1\ 1\ -1\ 1)$ and $\{x_i\}=(1\ -1\ 1\ -1\ 1)$ under the given interaction matrix $\{w_{ij}\}$.

As described above, according to the embodiments, one node in the neural network device can be assigned to one bit (one magnetic domain). This is different from the conventional neural network device in which one node is assigned to one ReRAM element or one or more transistors. Assigning one node to one bit further facilitates manufacturing a neural network device having ten billion or more nodes. The conventional device using a semiconductor circuit for a node requires complex interconnects and consumes high energy for computation. According to the embodiments, the main part of computation can be performed by combination of e.g. a domain wall motion-based magnetic recording element and a semiconductor element. This can achieve simplification of interconnects and significant energy saving. The domain wall motion-based magnetic recording element can be replaced by a magnetic recording tape or a magnetic recording disk including a mechanical driving device.

Sixth Embodiment

Figure 13:
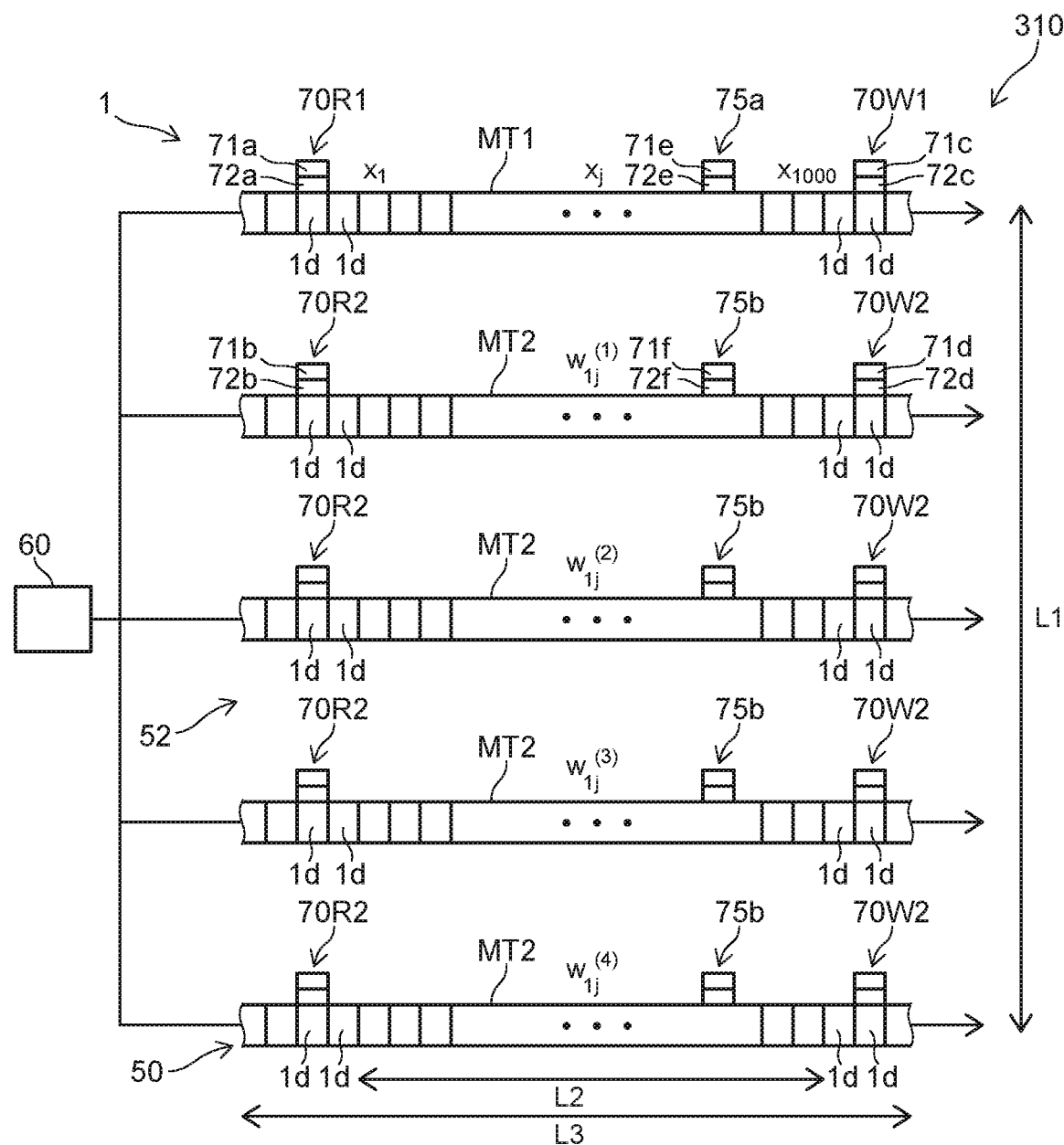
FIG. 13 is a schematic view illustrating a computing device according to a sixth embodiment.

FIG. 13 is a schematic view illustrating a computing device according to a sixth embodiment.

FIGS. 14 to 17 are schematic views illustrating computing devices according to the sixth embodiment.

The computing device 310 includes a first magnetic section 1 and a memory section 50 shown in FIG. 13. The first magnetic section 1 includes at least one first magnetic track MT1. The memory section 50 includes a second magnetic section 52. The second magnetic section 52 includes at least one second magnetic track MT2. In this example, the second magnetic section 52 includes a plurality of second magnetic tracks MT2. Each of the first magnetic track MT1 and the second magnetic track MT2 includes a plurality of magnetic domains 1d.

Each of the first magnetic track MT1 and the second magnetic track MT2 is e.g. at least part of a domain wall motion-based memory element. Each of the first magnetic track MT1 and the second magnetic track MT2 is e.g. at least part of a racetrack element, at least part of a skyrmion element, or at least part of a bubble domain element.

The control section 60 supplies a second current to one of the plurality of second magnetic tracks MT2. When the second current is supplied to the second magnetic track MT2, a plurality of magnetic domains 1d included in the second magnetic track MT2 move.

The computing device 310 includes a first reading section 70R1, a second reading section 70R2, a first writing section 70W1, and a second writing section 70W2.

The first reading section 70R1 reads magnetization information of one of the plurality of magnetic domains 1d of the first magnetic track MT1. For instance, the first reading section 70R1 includes a first magnetic layer 71a and a first intermediate layer 72a. The first intermediate layer 72a is provided between the first magnetic layer 71a and part of the first magnetic track MT1.

The second reading section 70R2 reads magnetization information of one of the plurality of magnetic domains 1d of the second magnetic track MT2. For instance, the second reading section 70R2 includes a second magnetic layer 71b and a second intermediate layer 72b. The second intermediate layer 72b is provided between the second magnetic layer 71b and part of the second magnetic track MT2.

The first writing section 70W1 writes magnetization information to one of the plurality of magnetic domains 1d of the first magnetic track MT1. For instance, the first writing section 70W1 includes a third magnetic layer 71c and a third intermediate layer 72c. The third intermediate layer 72c is provided between the third magnetic layer 71c and a different part of the first magnetic track MT1.

The second writing section 70W2 writes magnetization information to one of the plurality of magnetic domains 1d of the second magnetic track MT2. For instance, the second writing section 70W2 includes a fourth magnetic layer 71d and a fourth intermediate layer 72d. The fourth intermediate layer 72d is provided between the fourth magnetic layer 71d and a different part of the second magnetic track MT2.

For instance, the first reading section 70R1, the second reading section 70R2, the first writing section 70W1, and the second writing section 70W2 are electrically connected to the control section 60.

For instance, the control section 60 supplies current between the first magnetic track MT1 and the first magnetic layer 71a. The electric resistance between the first magnetic track MT1 and the first magnetic layer 71a changes with the relative angle between the direction of magnetization of the magnetic domain 1d included in the aforementioned part of the first magnetic track MT1 and the direction of magnetization of the first magnetic layer 71a. By detecting this electric resistance, the control section 60 reads magnetization information stored in the magnetic domain 1d. The control section 60 may detect a value corresponding to the electric resistance (such as voltage value or current value). Likewise, the control section 60 supplies current between the second magnetic track MT2 and the second magnetic layer 71b. Thus, the control section 60 reads magnetization information of the magnetic domain 1d included in the aforementioned part of the second magnetic track MT2.

For instance, the control section 60 supplies current between the first magnetic track MT1 and the third magnetic layer 71c. The direction of magnetization of the magnetic domain 1d included in the aforementioned different part of the first magnetic track MT1 changes with the direction of this current. Thus, the control section 60 writes magnetization information to one of the plurality of magnetic domains 1d included in the first magnetic track MT1. Likewise, the control section 60 supplies current between the second magnetic track MT2 and the fourth magnetic layer 71d. Thus, the control section 60 writes magnetization information to a magnetic domain 1d included in the aforementioned different part of the second magnetic track MT2.

The first magnetic track MT1 and the plurality of second magnetic tracks MT2 are electrically connected to the control section 60. The control section 60 supplies a first current to the first magnetic track MT1. When the first current is supplied to the first magnetic track MT1, a plurality of magnetic domains 1d included in the first magnetic track MT1 move.

In the example shown in FIG. 13, the computing device 310 further includes a first means (first structural body) 75a. The computing device 310 may further include a second means (second structural body) 75b. The first means 75a generates magnetization fluctuation in at least one of the plurality of magnetic domains 1d included in the first magnetic track MT1. The second means 75b generates magnetization fluctuation in at least one of the plurality of magnetic domains 1d included in the second magnetic track MT2.

Each of the first means 75a and the second means 75b includes e.g. a microwave magnetic field generating device.

Each of these microwave magnetic field generating devices includes e.g. a spin torque oscillator device.

Each of the first means 75a and the second means 75b may or may not include a spin torque oscillator device. For instance, the first means 75a includes a fifth magnetic layer 71e and a fifth intermediate layer 72e. The fifth intermediate layer 72e is provided between the fifth magnetic layer 71e and the first magnetic track MT1.

For instance, the second means 75b includes a sixth magnetic layer 71f and a sixth intermediate layer 72f. The sixth intermediate layer 72f is provided between the sixth magnetic layer 71f and the second magnetic track MT2.

For instance, each of the first reading section 70R1, the first writing section 70W1, the first means 75a, and the first magnetic track MT1 is provided in a plurality. In this case, one of the plurality of first reading sections 70R1 reads magnetization information of one of the plurality of magnetic domains 1d included in one of the plurality of first magnetic tracks MT1. One of the plurality of first writing sections 70W1 writes magnetization information to one of the plurality of magnetic domains 1d included in one of the plurality of first magnetic tracks MT1. One of the plurality of first means 75a generates magnetization fluctuation in at least one of the plurality of magnetic domains 1d included in one of the plurality of first magnetic tracks MT1.

In the example shown in FIG. 13, each of the second reading section 70R2, the second writing section 70W2, and the second means 75b is provided in a plurality. One of the plurality of second reading sections 70R2 reads magnetization information of one of the plurality of magnetic domains 1d included in one of the plurality of second magnetic tracks MT2. One of the plurality of second writing sections 70W2 writes magnetization information to one of the plurality of magnetic domains 1d included in one of the plurality of second magnetic tracks MT2. One of the plurality of second means 75b generates magnetization fluctuation in at least one of the plurality of magnetic domains 1d included in one of the plurality of second magnetic tracks MT2.

Each of the first to sixth magnetic layers 71a-71f contains e.g. at least one selected from the group consisting of Fe, Co, and Ni. The first to sixth intermediate layers 72a-72f contain e.g. at least one selected from the group consisting of Cu, Au, and Ag. The first to fourth intermediate layers 72a-72d may contain at least one selected from the group consisting of oxide and nitride. The oxide contains e.g. oxygen and at least one selected from the first group consisting of Mg, Ca, Sr, Ti, V, Nb, and Al. The nitride contains nitrogen and at least one selected from the first group.

Figure 14:
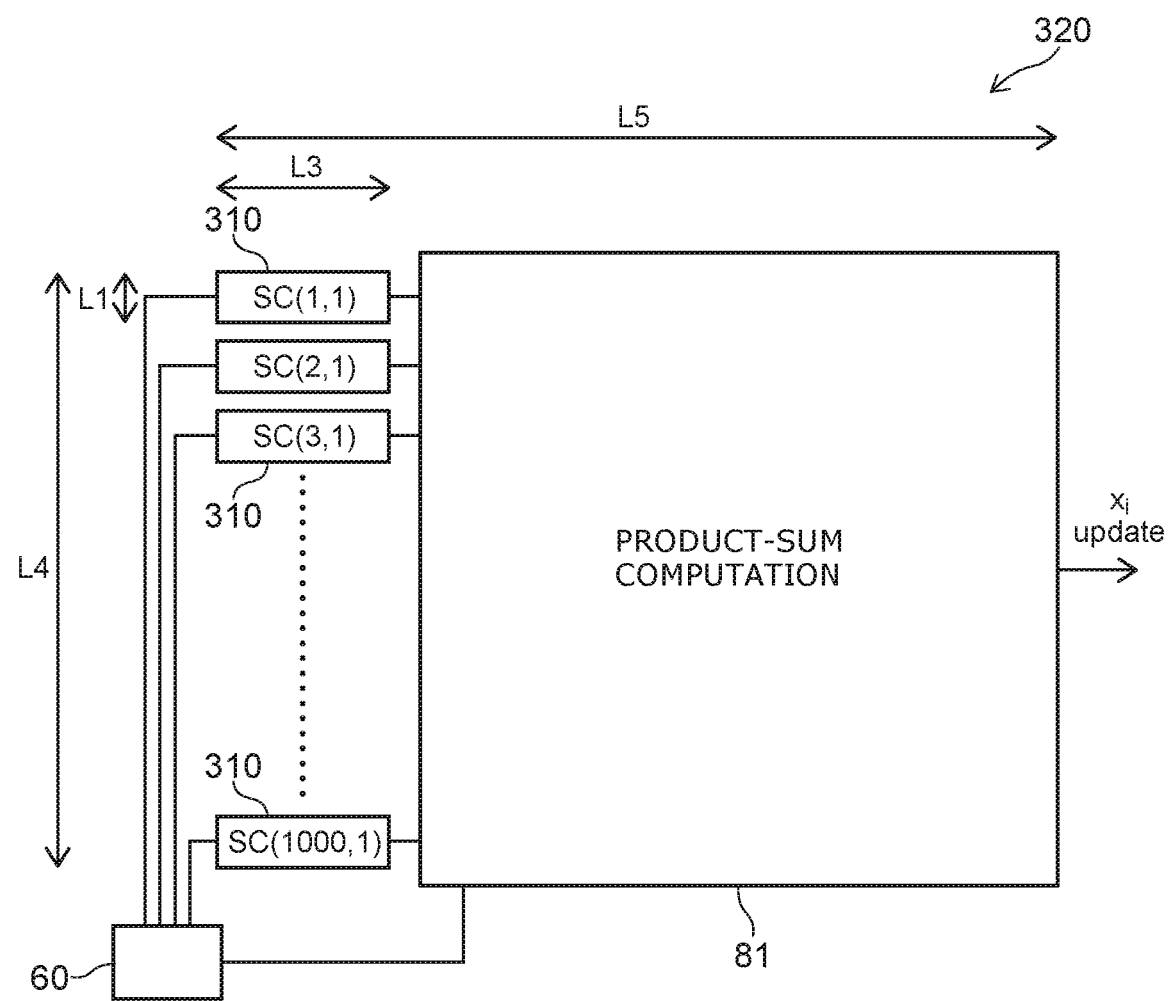
FIGS. 14 to 16 are schematic views illustrating computing devices according to the sixth embodiment.

As shown in FIG. 14, the computing device 320 includes a plurality of computing devices 310. The plurality of first magnetic sections 1 and the plurality of memory sections 50 (the plurality of second magnetic sections 52) included in the plurality of computing devices 310 are electrically connected to the control section 60 and a first computing section 81. For instance, the first computing section 81 performs product-sum computation using magnetization information stored in the first magnetic section 1 and magnetization information stored in the second magnetic section 2. For instance, the first computing section 81 writes the value obtained based on the computation result as magnetization information to one of the plurality of magnetic domains of the first magnetic section 1.

Figure 15:
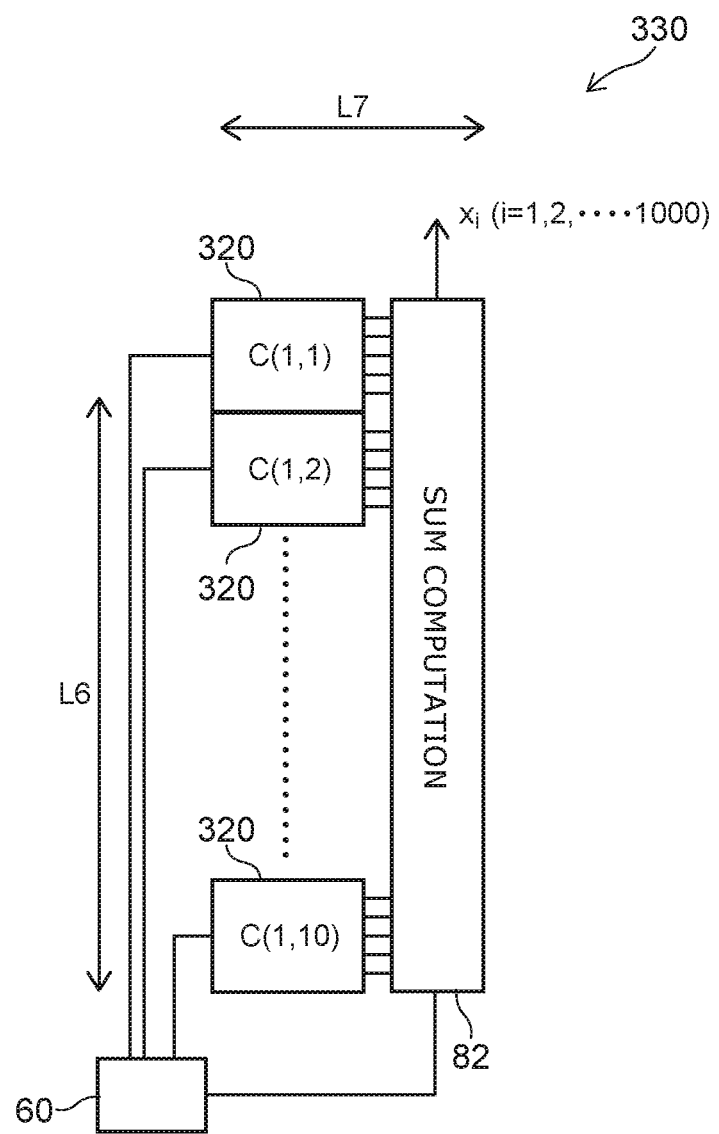

As shown in FIG. 15, the computing device 330 includes a plurality of computing devices 320. The plurality of computing devices 320 are electrically connected to the control section 60 and a second computing section 82. For instance, the second computing section 82 performs sum computation. This sum computation sums the respective computation results of the product-sum computation performed in the plurality of computing devices 310. For instance, the second computing section 82 writes the value obtained based on the computation result as magnetization information to one of the plurality of magnetic domains 1d included in one of the plurality of first magnetic sections 1.

Figure 16:
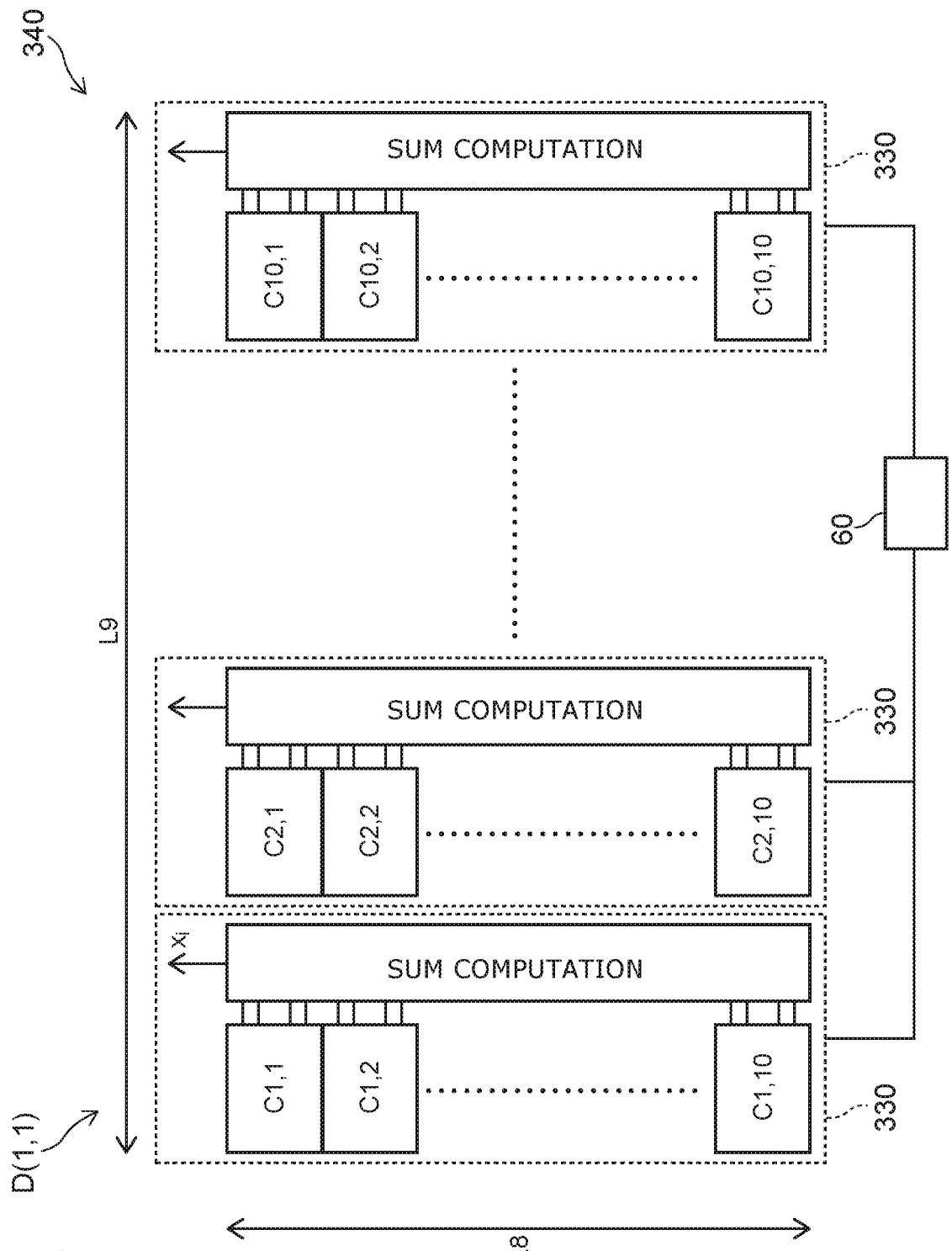

As shown in FIG. 16, the computing device 340 includes a plurality of computing devices 330. The plurality of computing devices 330 are electrically connected to the control section 60. The control section 60 outputs a control signal for cooperatively operating the plurality of computing devices 330 to the plurality of computing devices 330.

The Hopfield model is an interconnected neural network. In the Hopfield model, as shown in FIG. 8, n neurons (n=3 in the example of FIG. 8) are coupled through interactions $w_{ij}$ (where i, j=1, 2, . . . , n; $w_{ii}$=0, $w_{ij}$=$w_{ji}$). Considering this system as analogous to a spin system, its energy is represented by the following equation 6.

$$E = -\frac{1}{2}\sum_{ij} w_{ij} x_i x_j - \sum_i \theta_i x_i \qquad \text{[Equation 6]}$$

Here, $x_i$ is the value of node i, which is +1 or −1. $\theta_i$ is the threshold of node i. For simplicity of description, it is hereinafter assumed that $\theta_i$=0. In some cases, $x_i$=+1, −1 is replaced by $v_i$=1, 0. This description uses $x_i$ by which the correspondence to the Ising spin is easily seen. The solution to the problem is obtained by determining a vector {$x_i$} minimizing the energy E under the given interaction matrix {$w_{ij}$}. This is performed by the following procedure.

Step 1: The following equation 7 is calculated in consideration of the interaction $w_{ij}$ between an arbitrarily selected node i and all the other nodes j. In analogy to the Ising spin, $h_i$ is referred to as a local magnetic field acting on node i.

$$h_i = \sum_i w_{ij} x_i \qquad \text{[Equation 7]}$$

Step 2: The value $x_i$ of node i is updated as in the following equation 8 depending on whether the local magnetic field $h_i$ is positive or negative. This update is not synchronous update performed simultaneously on all the nodes, but is performed asynchronously for individual nodes.

$$x_i = +1 \; h_i \geq 0$$

$$x_i = -1 \; h_i < 0 \qquad \text{[Equation 8]}$$

Step 3: For a randomly selected node k again, a local magnetic field $h_k$ is calculated as in Step 2. Depending on whether its value is positive or negative, $x_k$ is updated as in equation 8.

Step 4: Steps 1-3 are repeated. When all $x_i$ become unchanged, the vector {$x_i$} is a solution.

Figure 17:
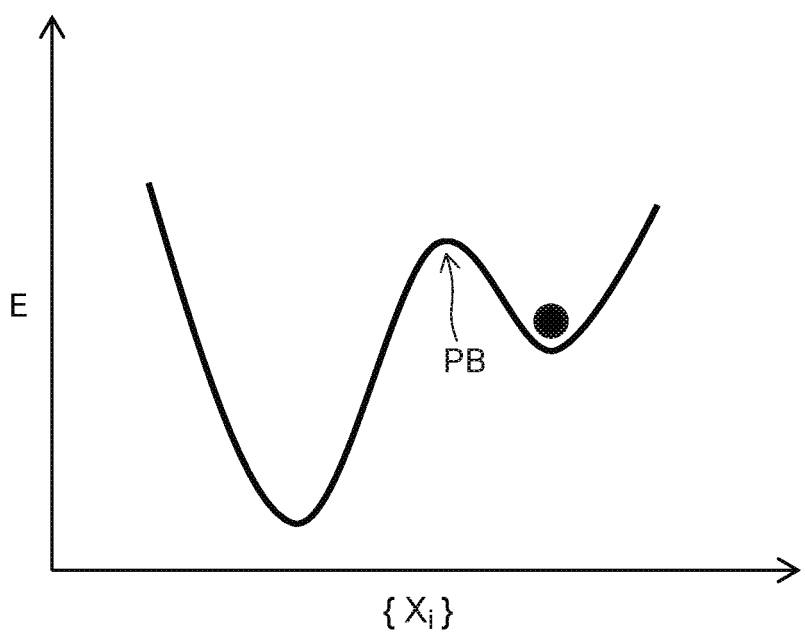
FIG. 17 is a graph illustrating the relationship between the vector and energy.

FIG. 17 is a graph illustrating the relationship between the vector and energy.

As shown in FIG. 17, the Hopfield model may fail to give a correct solution because the vector falls in a local minimum. In order to determine the global minimum, it is desirable to apply e.g. simulated annealing with noise.

According to the sixth embodiment, at least one magnetic domain 1d of the first magnetic section 1 can be used as a neuron of the interconnected neural network device, and at least one magnetic domain 1d of the second magnetic section 2 of the memory section 50 can be used as a synapse. This can easily increase the number of neurons and the number of synapses while suppressing the size increase of the neural network device.

For instance, the computing device 310 shown in FIG. 13 can be a minimum unit of the neural network device. The computing device 310 is referred to as a sub-core (SC). In this example, neurons $x_j$ (j=1, 2, . . . , 1000) are written to one first magnetic track MT1, and $w_{ij}$ is represented by 4 bits using four second magnetic tracks MT2. As an example, the length L1 shown in FIG. 14 is 60 nm. The length L2 is 10 μm. The length L3 of each of the first magnetic track MT1 and the second magnetic track MT2 is 30 μm. For instance, the number of neurons written to each magnetic track can be set to approximately 1000. Then, one neuron can be updated in approximately 1 μs.

The computing device 320 shown in FIG. 14 includes e.g. 1000 computing devices 310. That is, 1000 sub-cores are arranged in parallel. A core C(1,1) fully connected for 1000 neurons is obtained by providing the first computing section 81 functioning as a product-sum computing element and a determination circuit. The product-sum computing element (first computing section 81) calculates a magnetic field acting on neuron i as represented by the following equation 9.

$$h_i^c(1,1) = \sum_{j=1}^{10^3} \left( w_{ij}^{(1)} + 2w_{ij}^{(2)} + 4w_{ij}^{(3)} + 8w_{ij}^{(4)} \right) x_j \qquad \text{[Equation 9]}$$

$$= \sum_{j=1}^{10^3} w_{ij} x_j$$

The determination circuit (computing section 40) determines the sign of the magnetic field as in the following equation 10 and updates $x_i$. The length L4 shown in FIG. 14 is e.g. 100 μm. The length L5 is e.g. 130 μm.

$$h_i^c(1,1) > 0$$

$$h_i^c(1,1) < 0 \qquad \text{[Equation 10]}$$

Figure 18:
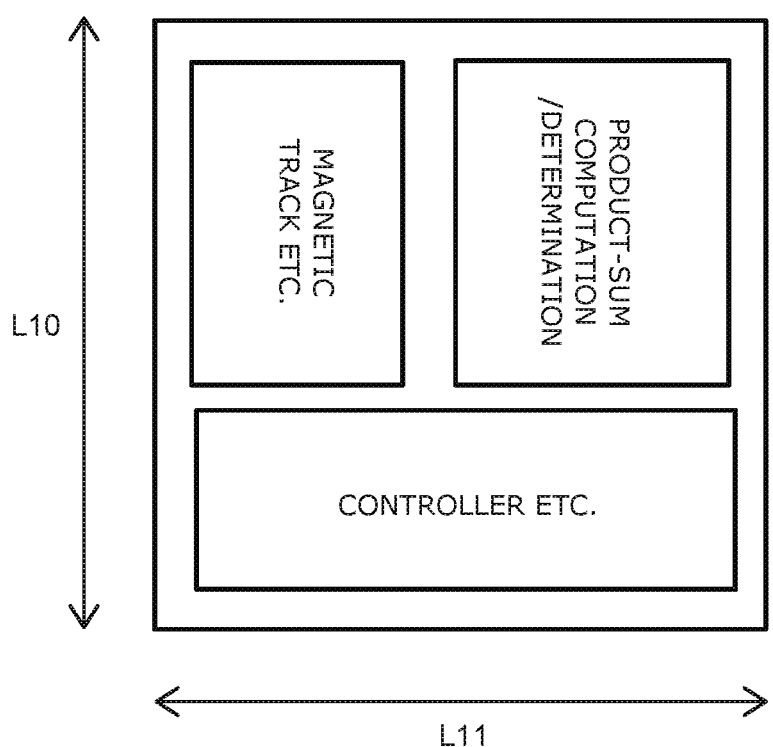
FIG. 18 is a schematic view illustrating a computing device according to a sixth embodiment.

FIG. 18 is a schematic view illustrating a computing device according to a sixth embodiment.

As shown in FIG. 18, a controller and so forth are added to this core C(1,1). Then, 1000 neurons are fully connected. This results in a neural network capable of updating all the neurons within 1 ms. The length L10 shown in FIG. 18 is e.g. 150 μm. The length L11 is e.g. 150 μm.

Here, the state $x_j$ of neuron j (j=1, 2, . . . , 1000) is written to one first magnetic track MT1 and represented by 1 bit. The state can be represented by a plurality of bits using a plurality of first magnetic tracks MT1 to support a Hopfield model with continuous variables.

Consider a fully-connected neural network with the number of neurons being $10^4$. In order to set the time necessary for updating all the neurons to 1 ms or less, it is desirable to increase parallel computation. This can be achieved by the structure shown in FIG. 15. The core C(1,1) is a core corresponding to i=1, 2, . . . , 1000, j=1, 2, . . . , 1000 as shown in FIG. 14. C(1,2) is a core corresponding to i=1, 2, . . . , 1000, j=1001, 1002, . . . , 2000. C(1,10) is a core corresponding to i=1, 2, . . . , 1000, j=9001, 9002, . . . , 10000. The length L6 shown in FIG. 15 is e.g. 1000 μm. The length L7 is e.g. 150 μm.

The sum of the outputs of the respective cores is calculated as in equation 11 and determined whether it is positive or negative to update $x_i$ (i=1, 2, . . . , 1000).

$$h_i^d(1) = \sum_{m=1}^{10} h_i^n(1, m)$$ [Equation 11]

Furthermore, ten copies of the structure shown in FIG. 15 are arranged to form a D(1,1) structure shown in FIG. 16. Thus, all the neurons $x_i$ (i=1, 2, . . . , 10000) can be updated in a time of approximately 1 ms. The length L8 shown in FIG. 16 is e.g. 1000 μm. The length L9 is e.g. 1500 μm.

The D(1,1) structure can be provided with a determination circuit and a control circuit to obtain a fully-connected neural network with the size being several millimeters and the number of neurons being $10^4$. The D(1,m) structures can be arranged like C(1,m) shown in FIG. 16 to form an E(1,m) structure. This results in a fully-connected neural network with the size being several centimeters and the number of neurons being $10^5$.

As described above, in this embodiment, the domain wall motion-based element is used as a neuron and a synapse. Thus, a fully-connected neural network with a large scale and high speed can be configured while suppressing the size increase of the neural network device. This embodiment has described the examples with the number of neurons being $10^3$, $10^4$, and $10^5$. The computing device according to this embodiment may include a larger number of neurons. Thus, a network with a larger scale can be configured.

FIGS. 19 to 22 are schematic views illustrating an alternative computing device according to the sixth embodiment.

Figure 19:
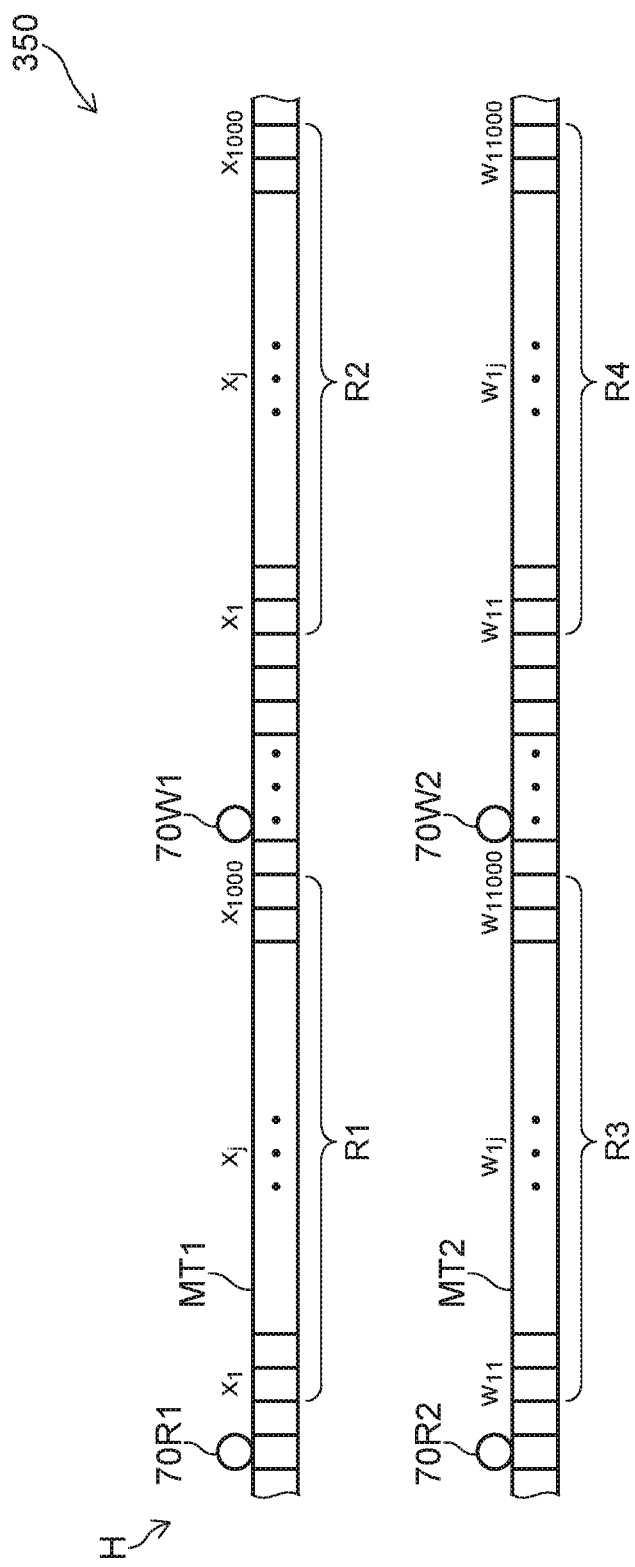
FIGS. 19 to 22 are schematic views illustrating an alternative computing device according to the sixth embodiment.

The computing device 350 includes a hard disk drive H shown in FIG. 19. The hard disk drive H includes a first magnetic track MT1 and a second magnetic track MT2. In this example, each of the first reading section 70R1 and the second reading section 70R2 includes a reading head RH shown in FIG. 20. Each of the first writing section 70W1 and the second writing section 70W2 includes a writing head WH. The first means 75a includes a microwave magnetic field generating device MG.

The reading head RH detects a magnetic field leaked from one of the plurality of magnetic domains 1d and reads magnetization information. The writing head WH applies a magnetic field to one of the plurality of magnetic domains 1d and writes magnetization information. The microwave magnetic field generating device MG generates magnetization fluctuation in at least one of the plurality of magnetic domains 1d.

Figure 21:
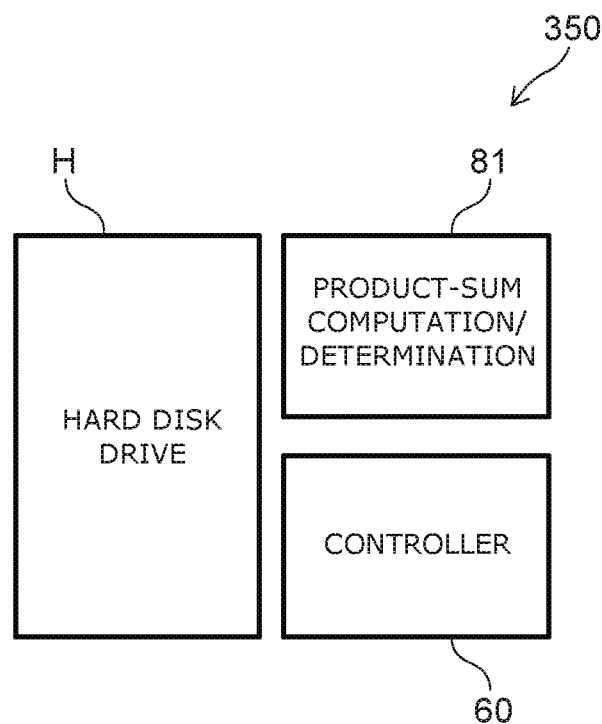

As shown in FIG. 21, the computing device 350 according to this embodiment includes a hard disk drive H and semiconductor devices such as a product-sum computation/determination device (first computing section 81) and a controller (control section 60). The first magnetic track MT1 of the hard disk drive H stores the content $x_i$ of the i-th neuron. The second magnetic track MT2 stores the content of the (i,j) component $w_{ij}$ of the interaction (synapse) matrix.

The hard disk drive H includes e.g. five disks. For instance, one magnetic track is provided on one side of each disk. In this case, a total of ten independent magnetic tracks exist in the hard disk drive H. For instance, in the case of the Hopfield model, one of the ten magnetic tracks is assigned to the first magnetic track MT1 for recording up/down of neurons $x_i$. For instance, eight of the ten magnetic tracks are assigned to the second magnetic track MT2 for storing the synapse matrix $w_{ij}$. That is, $w_{ij}$ can be represented by 8 bits. The number of treated neurons is determined in consideration of e.g. the computation time (update time). For instance, the transfer speed of the hard disk drive H is approximately 1 Gb/s, and the first magnetic track MT1 includes 1000 neurons. In this case, the update time for one neuron is approximately 1 μs, and the update time for 1000 neurons is approximately 1 ms.

The number of $w_{ij}$ (i, j=1, 2, . . . , 1000) is 1000 times the number of $x_i$. Thus, the initial value of $x_i$, and $w_{ij}$ are written to e.g. the first magnetic track MT1 and the second magnetic track MT2 as shown in FIG. 19. However, for simplicity, $w_{ij}$ is represented by 1 bit in FIG. 19.

Figure 20:
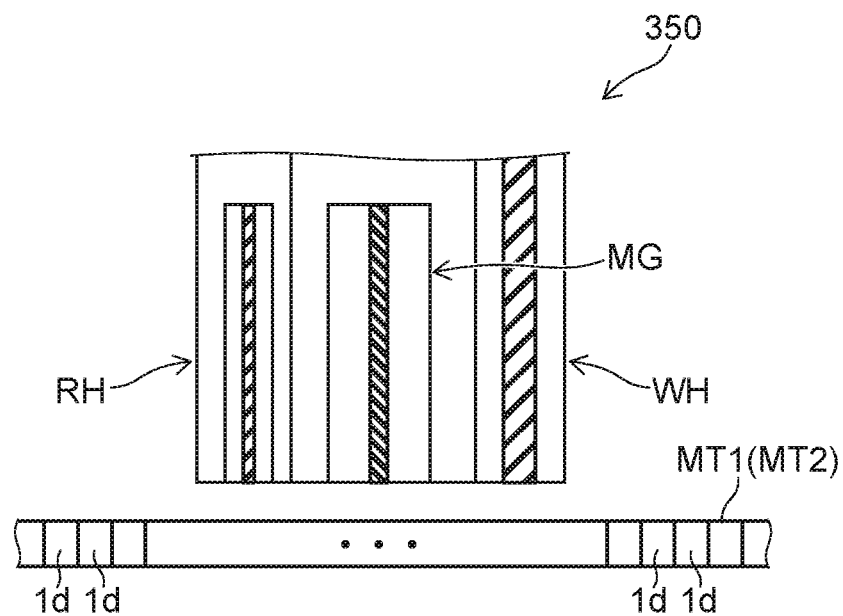

For instance, the first magnetic track MT1 includes a first region R1 and a second region R2. The second magnetic track MT2 includes a third region R3 and a fourth region R4. For instance, $x_j$ and $w_{1j}$ read from the first region R1 and the third region R3 are sent to the first computing section 81 (product-sum computation/determination device) of FIG. 21. Calculation of $h_1$ and update of $x_1$ are performed in accordance with equations 7 and 8. The updated $x_1$ is written to the second region R2 following the first region R1. $x_j$ and $w_{ij}$ read from the second region R2 and the fourth region R4 are updated in the product-sum computation/determination device. Writing of the updated $x_1$ to the second region R2 needs to precede reading it. The first writing section 70W1 (writing head (recording head)) must be located ahead of the first reading section 70R1 (reading head (reproducing head)). By repeating these operations, $x_i$ (i=1, 2, . . . , 1000) are sequentially updated. In order to determine a correct result (the global minimum of energy), it is effective to apply noise as shown in FIG. 17. The computing device 350 may include a first means 75a (e.g., microwave magnetic field generating device). The microwave magnetic field generating device applies a microwave magnetic field having a frequency near the resonance frequency of magnetization to at least one of the plurality of magnetic domains of the first magnetic track MT1. This enables the potential barrier PB shown in FIG. 17 to be surpassed. The source of the microwave is preferably based on a spin torque oscillator element from the viewpoint of cost. The spin torque oscillator element is provided preferably between the first reading section 70R1 (reading head) and the first writing section 70W1 (writing head) as shown in FIG. 20. Preferably, the intensity of noise generated by the first means 75a is made strong at the beginning, and made weaker as the update proceeds. Thus, the current flowing in the spin torque oscillator element is preferably variable.

Figure 22:
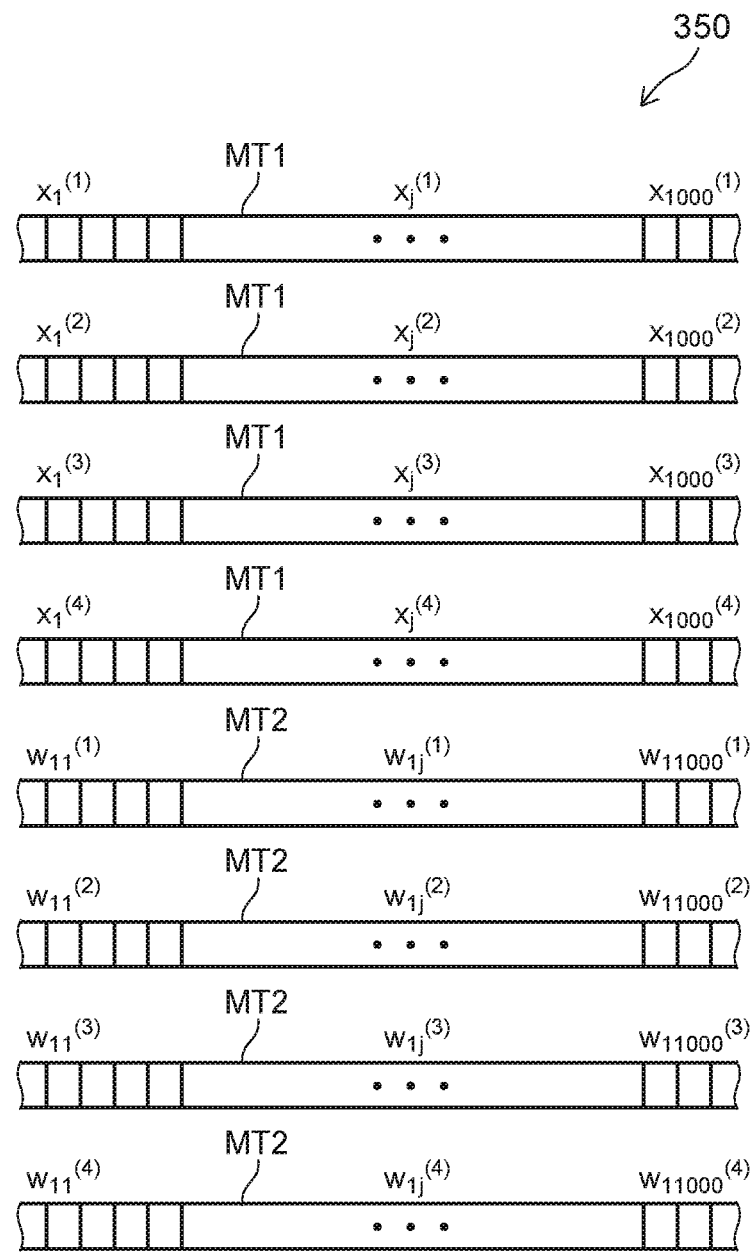

An alternative example is computation by a Hopfield model with continuous variables. In this case, the computing device 350 includes e.g. four first magnetic tracks MT1 for recording up/down of neurons $x_j$ and four second magnetic tracks MT2 for storing the synapse matrix $w_{ij}$. That is, as shown in FIG. 22, $x_j$ and $w_{ij}$ can be represented by 4 bits each.

As described above, a plurality of magnetic tracks of the hard disk drive H composed of a plurality of disks are used as neurons and synapses to perform computation. Thus, a large-scale and inexpensive neural network can be configured and utilized for e.g. combinatorial optimization problems, which are less manageable for the conventional processor. In the examples of the embodiments described above, the number of neurons is set to 1000. The number of neurons can be set to 100 or 10000. It is also possible to use a plurality of hard disk drives H in parallel.

In the computing devices according to the sixth embodiment described above, neurons are stored in the first magnetic track MT1, and synapses are stored in the second magnetic track MT2. In these computing devices, it is also possible to store neurons in a partial region of the first magnetic track MT1, and synapses in a different partial region of the first magnetic track MT1.

The embodiments described above can increase the scale and reduce the energy consumption of a computing device or a computing system.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the computing device such as the first magnetic section, the second magnetic section, the nonmagnetic section, the first region, the second region, the third region, the writing region, the first reading section, the second reading section, the writing section, the computing section, the first interconnect, the second interconnect, the signal reversal section, the switch, the memory section, the control section, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all computing devices practicable by an appropriate design modification by one skilled in the art based on the computing devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A computing device comprising:
a magnetic section;
a first reading section configured to output a first signal corresponding to a magnetization state of a partial region of the magnetic section;
a memory section; and
a computing section configured to perform computation using the first signal in a case where first information stored in the memory section is in a first state, and to perform the computation using a reverse signal of the first signal in a case where the first information is in a second state;
wherein the computing section is configured to perform the computation without using the first signal in a case where the first information is in a third state being different from the first state and different from the second state.

2. The device according to claim 1, wherein the memory section stores second information outputted from the computing section.

3. The device according to claim 1, wherein
the magnetic section includes a plurality of magnetic domains, and
the partial region of the magnetic section includes one of the plurality of magnetic domains.

4. The device according to claim 3, further comprising:
a control section,
wherein the control section supplies a current to the magnetic section and moves the plurality of magnetic domains.

5. The device according to claim 1, wherein the computing section includes a MOS transistor.

6. The device according to claim 1, wherein
the first reading section includes a first magnetic layer and an intermediate layer, and
the intermediate layer is provided between part of the magnetic section and the first magnetic layer.

7. A computing device comprising:
a magnetic section including a first set of magnetic domains connected in series and a second set of magnetic domains connected in series, wherein the first set of magnetic domains includes a first region and a second region, the second set of magnetic domains includes a third region, and one end of the second set of magnetic domains is disposed adjacent to a magnetic domain of the first set of magnetic domains between the first region and the second region;
a first reading section configured to output a first signal corresponding to a magnetization state of the first region;
a second reading section configured to output a second signal corresponding to a magnetization state of the second region;
a memory section;
a computing section configured to perform computation using the first signal when first information stored in the memory section is in a first state, to perform computation using a reverse signal of the second signal when the first information is in a second state, and to output computation result to the memory section to be stored as second information; and
a writing section configured to place at least part of the third region in a magnetization state corresponding to the second information.

8. The device according to claim 7, further comprising:
a control section configured to perform a first operation and a second operation based on the first information stored in the memory section,
wherein in the first operation, the control section supplies a first current between the third region and the first region, and
in the second operation, the control section supplies a second current between the third region and the second region.

9. The device according to claim 7, wherein
the writing section includes a writing magnetic layer and a writing intermediate layer, and
the writing intermediate layer is provided between the writing magnetic layer and the magnetic section.

10. The device according to claim 7, wherein
the writing section includes a magnetic field application section and a magnetic element,
the magnetic element includes a first magnetic layer, a writing intermediate layer, and a second magnetic layer, and
the writing intermediate layer is provided between the first magnetic layer and the second magnetic layer.

11. A computing device comprising:
a first magnetic section including a first set of magnetic domains connected in series and a second set of magnetic domains connected in series, wherein the first set of magnetic domains includes a first region and a second region, the second set of magnetic domains includes a third region, and one end of the second set of magnetic domains is disposed adjacent to a magnetic domain of the first set of magnetic domains between the first region and the second region;
a second magnetic section, direction of magnetization of the second magnetic section being opposite to direction of magnetization of the second region;
a first reading section configured to output a first signal corresponding to a magnetization state of the first region;
a second reading section configured to output a second signal corresponding to a magnetization state of the second magnetic section;
a memory section;
a computing section configured to perform computation using the first signal when first information stored in the memory section is in a first state, to perform computation using the second signal when the first information is in a second state, and to output computation result to the memory section to be stored as second information; and
a writing section configured to place at least part of the third region in a magnetization state corresponding to the second information.

12. A computing device comprising:
a plurality of computing blocks, each of the plurality of computing blocks including:
a magnetic section including a first set of magnetic domains connected in series and a second set of magnetic domains connected in series, wherein the first set of magnetic domains includes a first region and a second region, the second set of magnetic domains includes a third region, and one end of the second set of magnetic domains is disposed adjacent to a magnetic domain of the first set of magnetic domains between the first region and the second region;
a first reading section configured to output a first signal corresponding to a magnetization state of the first region;
a second reading section configured to output a second signal corresponding to a magnetization state of the second region;
a memory section;
a computing section configured to perform computation using the first signal when first information stored in the memory section is in a first state, to perform computation using a reverse signal of the first signal when the first information is in a second state, and to output computation result to the memory section to be stored as second information; and
a writing section configured to place at least part of the third region in a magnetization state corresponding to the second information; and
a driving circuit connected to the plurality of magnetic sections.

* * * * *

UNITED STATES PATENT AND TRADEMARK OFFICE
CERTIFICATE OF CORRECTION

PATENT NO. : 11,169,732 B2
APPLICATION NO. : 15/924690
DATED : November 9, 2021
INVENTOR(S) : Rie Sato et al.

It is certified that error appears in the above-identified patent and that said Letters Patent is hereby corrected as shown below:

On the Title Page

Item (74), in the Attorney, Agent, or Firm, Line 1, "Handerson," should read --Henderson,--.

Signed and Sealed this
Nineteenth Day of April, 2022

Katherine Kelly Vidal
*Director of the United States Patent and Trademark Office*